(12) United States Patent
Pathak et al.

(10) Patent No.: US 10,950,761 B2
(45) Date of Patent: Mar. 16, 2021

(54) MATRIX-INCORPORATED ORGANIC-INORGANIC METAL HALIDE PEROVSKITE NANO-PARTICLES AS LUMINESCENT MATERIAL

(71) Applicant: Cambridge Enterprise Limited, Cambridge (GB)

(72) Inventors: Sandeep Pathak, Oxford (GB); Henry James Snaith, Oxford (GB); Richard Friend, Cambridge (GB)

(73) Assignee: Cambridge Enterprise Limited, Cambridge (GB)

( * ) Notice: Subject to any disclaimer, the term of this patent is extended or adjusted under 35 U.S.C. 154(b) by 430 days.

(21) Appl. No.: 15/748,062

(22) PCT Filed: Jul. 27, 2016

(86) PCT No.: PCT/GB2016/052292
§ 371 (c)(1),
(2) Date: Apr. 23, 2018

(87) PCT Pub. No.: WO2017/017441
PCT Pub. Date: Feb. 2, 2017

(65) Prior Publication Data
US 2019/0348577 A1 Nov. 14, 2019

(30) Foreign Application Priority Data
Jul. 28, 2015 (GB) .................................. 1513272.3

(51) Int. Cl.
*H01L 33/50* (2010.01)
*C09K 11/06* (2006.01)
(Continued)

(52) U.S. Cl.
CPC ............ *H01L 33/504* (2013.01); *C09K 11/06* (2013.01); *C09K 11/664* (2013.01); *H01L 33/0075* (2013.01)

(58) Field of Classification Search
CPC ..... H01L 33/504; C09K 11/664; C09K 11/02; C09K 11/06
See application file for complete search history.

(56) References Cited

U.S. PATENT DOCUMENTS 9,507,206 B2 11/2016 Li
10,294,420 B2 * 5/2019 Luchinger ............. G02F 1/1336
2005/0285041 A1 12/2005 Srivastava et al.

FOREIGN PATENT DOCUMENTS

JP   2008 227330     9/2008
WO  WO 2013/171520  11/2013

OTHER PUBLICATIONS

Baikie et al., "Synthesis and crystal chemistry of the hybrid perovskite $(CH_3NH_3)PbI_3$ for solid-state sensitized solar cell applications," *Journal of Materials Chemistry* 1(18):5628-2641, Jan. 2013.

(Continued)

*Primary Examiner* — C Melissa Koslow
(74) *Attorney, Agent, or Firm* — Klarquist Sparkman, LLP

(57) ABSTRACT

The present invention relates to a light emitting device comprising a light source and a luminescent material, which luminescent material comprises one or more matrix materials and two pluralities of nanoparticles, which two pluralities of nanoparticles comprise different perovskite compounds. The invention also relates to a luminescent material.

20 Claims, 16 Drawing Sheets

(51) Int. Cl.
C09K 11/66 (2006.01)
H01L 33/00 (2010.01)

(56) References Cited

OTHER PUBLICATIONS

Chuang et al., "Emission-Tunable CuInS$_2$/ZnS Quantum Dots: Structure, Optical Properties, and Application in White Light-Emitting Diodes with High Color Rendering Index," *ACS Applied Materials and Interfaces* 6:15379-15387, 2014.

Dabbousi et al., "Electroluminescence from CdSe quantum-dot/polymer composites," *Applied Physics Letters* 66(11):1316-1318, Mar. 1995.

Deschler et al., "High Photoluminescence Efficiency and Optically Pumped Lasing in Solution-Processed Mixed Halide Perovskite Semiconductors," *The Journal of Physical Chemistry Letters* 5(8):1421-1426, 2014.

Di et al., "Size-Dependent Photon Emission from Organometal Halide Perovskite Nanocrystals Embedded in an Organic Matrix," *The Journal of Physical Chemical Letters* 6(3):446-450, 2015.

Dimesso et al., "Properties of CH$_3$NH$_3$PbX$_3$ (X=I, Br, Cl) Powders as Precursors for Organic-Inorganic Solar Cells," *Chemistry of Materials* 26(23):6762-6770, Nov. 2014.

Eperon et al., "Formamidinium Lead Trihalide: A Broadly Tunable Perovskite for Efficient Planar Heterojunction Solar Cells," *Energy and Environmental Science* 7:982-988, Jan. 2014.

Filip et al., "Steric Engineering of Metal-Halide Perovskites with Tunable Optical Band Gaps," *Nature Communications* 5:5757-5765, Dec. 2014.

Guangru et al., "Efficient Light-Emitting Diodes Based on Nanocrystalline Perovskite in a Dielectric Polymer Matrix," *Nano Letters* 15(4):2640-2644, 2015.

Hoke et al., "Reversible Photo-Induced Trap Formation in Mixed-Halide Hybrid Perovskites for Photovoltaics," *Chemical Science* 6:613-617, 2015.

Jang et al., "White Light-Emitting Diodes with Excellent Color Rendering Based on Organically Capped CdSe Quantum Dots and Sr$_3$SiO$_5$:Ce$^{3+}$,Li$^+$ Phosphors," *Advanced Materials* 20:2696-0702, 2008.

Knop et al., "Alkylammonium Lead Halides. Part 2. CH$_3$NH$_3$PbX$_3$ (X=Cl, Br, I) Perovskites: Cuboctahedral Halide Cages with Isotropic Cation Orientation," *Canadian Journal of Chemistry* 68(3):412-422, 1990.

Liang et al., "Quantum Dots-Based Flexible Films and Their Application as the Phosphor in White Light-Emitting Diodes," *Chemistry of Materials* 26:2595-2600, 2014.

Mitzi, "Templating and Structural Engineering in Organic-Inorganic Perovskites," *Journal of the Chemical Society, Dalton Transactions* pp. 1-12, 2001.

Papavassiliou et al., "Nanocrystalline/Microcrystalline Materials Based on Lead-Halide Units," *Journal of Materials Chemistry* 22(17):8271-8280, May 2012.

Protesescu et al., "Nanocrystals of Cesium Lead Halide Perovskites (CsPbX$_3$, X=CL, Br and I): Novel Optoelectronic Materials Showing Bright Emission with Wide Color Gamut," *Nano Letters* 15(6):3692-3696, 2015.

Schmidt et al., "Nontemplate Synthesis of CH$_3$NH$_3$PbBr$_3$ Perovskite Nanoparticles," *Journal of the American Chemical Society* 136:850-853, 2014.

Schreuder et al., "White Light-Emitting Diodes Based on Ultrasmall CdSe Nanocrystal Electroluminescence," *Nano Letters* 10(2):573-576, 2010.

Tan et al., "Bright Light-Emitting Diodes Based on Organometal Halide Perovskite," *Nature Nanotechnology* 9(9):687-692, Sep. 2014.

Wasylishen et al., "Cation Rotation in Methylammonium Lead Halides," *Solid State Communications* 56(7):581-582, 1985.

Wood et al., "Colloidal Quantum Dot Light-Emitting Devices" *Nano Review* 1(1):1-7, Jul. 2010.

Xing et al., "Low-temperature Solution-Processed Wavelength-Tunable Perovskites for Lasing," *Nature Materials* 13:476-480, May 2014.

Zhang et al., "Brightly Luminescent and Color-Tunable Colloidal CH$_3$NH$_3$PbX$_3$ (X=Br, I, Cl) Quantum Dots: Potential Alternatives for Display Technology," *ACS Nano* 9(4):4533-4542, Mar. 2015.

Third Party Observations, with English-Language Translation, dated Dec. 26, 2019, from corresponding JP Application No. 2018-504265.

* cited by examiner

MATRIX-INCORPORATED ORGANIC-INORGANIC METAL HALIDE PEROVSKITE NANO-PARTICLES AS LUMINESCENT MATERIAL

CROSS REFERENCE TO RELATED APPLICATIONS

This is the U.S. National Stage of International Application No. PCT/GB2016/052292, filed Jul. 27, 2016, which was published in English under PCT Article 21(2), which in turn claims the benefit of Great Britain Application No. 1513272.3, filed Jul. 28, 2015. These prior applications are incorporated herein in their entirety.

FIELD OF THE INVENTION

The present invention relates to a light emitting device comprising a light source and a luminescent material. Also described is a luminescent material comprising two or more types of nanoparticles and a process for producing luminescent materials and light emitting devices.

BACKGROUND OF THE INVENTION

Approximately 25%, of the global electricity demand is used for lighting, which accounts for 1.9 GT of $CO_2$ emissions. In order to reduce the energy demand for lighting, white light emitting diodes are becoming increasing prevalent, which are much more efficient than incandescent bulbs and fluorescent tube lighting. If all conventional white-light sources in the world were converted to the energy-efficient LED light sources, energy consumption could be reduced by around 1,000 TW h $yr^{-1}$, the equivalent of about 230 typical 500-MW coal plants, reducing greenhouse gas emission by about 200 million tonnes.

A standard white light LED is typically composed of a blue GaN LED (440-470 nm emission) with a coating of either a yellowgreen phosphor or a combination of red and green phosphors (multi-phosphor approach). The role of the phosphor is to absorb a certain fraction of the blue light, down-convert and reemit this light across the visible spectrum. Most commercially available single-phosphor pc-LEDs are based on $Ce^{3+}$ doped Yttrium Aluminum Garnet (YAG:Ce:$Y_{3-x}Gd_xAl_{5-y}GayO_{12}$:Ce) as the yellow-emitting phosphor material. Although effective, this suffers from a limited emission in the red spectral region in comparison to the green region, resulting in cool white light (correlated color temperature 4000-8000 K), and a limited color rendering index (CRI; usually <75). For indoor lighting, lower correlated color temperature (<4000 K) and higher CRIs (>80) are required. In simple terms, the light emitted from most LEDs is much more blue than natural daylight, and is hence not optimum. The problem that needs to be solved is to find a more suitable emitting material than the existing phosphors for white light emitting diodes.

Semiconductor NCs, known as quantum dots, may provide an alternative way to generate white LEDs. Quantum dots synthesized from II-VI semiconductors can be employed in place of phosphors, since they can be tuned to radiate any color simply by changing the chemical composition and physical size of the dot, which is typically 2-10 nm. Semiconductor quantum dots have recently found applications in displays.

Papavassiliou, G. C. et al., J. Mater. Chem. 22, 8271, 2012 describes the synthesis of nanocrystals of lead halide compounds. Protesescu, L. et al., Nanocrystals of Cesium Lead Halide Perovskites ($CsPbX_3$, X=Cl, Br, and I): Novel Optoelectronic Materials Showing Bright Emission with Wide Color Gamut, Nano Lett, (2015) describes nanocrystals comprising cesium perovskites. Schmidt, L. C. et al., J. Am. Chem. Soc. 136, 850, 2014 (Nontemplate synthesis of $CH_3NH_3PbBr_3$ perovskite nanoparticles) describes the synthesis of perovskite nanocrystals in solution.

Zhang F. et al., ACS Nano, 9, 4, 4533-4542, 2015 describes the use of quantum dots of a single organic-inorganic perovskite as a phosphor replacement to produce white light. However, there is no discussion of the possibility of using two or more different quantum dots of different perovskite compounds to produce an optimized emission profile for the light emitting device.

It has been established previously that halide ions in metal-halide perovskite materials can migrate between different perovskite compounds and alter the composition of these compounds. This halide ion-exchange is described in Hoke et al., Chem. Sci., 2015, 6, 613. For luminescent materials and phosphors, it is very important that the emission spectrum is predictable and does not change over time. Halide exchange between different perovskites has previously been expected to cause variation in the photoluminescent properties of these perovskites and instability in their photoluminescence spectra. This has prevented two or more of these compounds being used simultaneously in many applications. There has been no suggestion previously of how to overcome this halogen exchange problem for metal halide perovskites.

There is a need to develop new luminescent materials useful as phosphors producing warmer white light.

SUMMARY OF THE INVENTION

The inventors have developed spectrally tuneable nanocrystals (NCs) which can be synthesised from crystalline compounds, for instance organic-inorganic metal halide perovskites. Both the tuneable chemistry of this family of materials and the quantum confinement of the NCs can be exploited to synthesise NCs with an emission wavelength over the entire range of the visible spectrum from 410 to 775 nm, with high quantum efficiency.

The inventors have surprisingly found that nano-crystals of two or more different perovskites may be included in an insulating and transparent polymer matrix and subsequently used for fabricating perovskite NC/polymer composite films. The inventors have discovered that NCs with a range of emission wavelengths can be blended together in a common polymer host to create a film with white light emission with a tunable hue without rapid degradation of the white light emission due to ion exchange between different perovskites. The inventors have also demonstrated that multiple layers containing different NCs can be stacked on top of each other to realise true white light emission which is stable over time. Finally, a fully operational solid-state white LED by illuminating films of different perovskite nanocrystals with a commercial blue LED has been developed by the inventors, demonstrating the first proof of concept for a white light emitting diode incorporating two or more perovskite NCs emitters.

Thus, the invention provides a light emitting device comprising a light source and a luminescent material, which luminescent material comprises:
  one or more matrix materials, and, disposed in said matrix materials,
  a first plurality of nanoparticles comprising a first crystalline compound, and a second plurality of nanoparticles comprising a second crystalline compound,
wherein the first crystalline compound and the second crystalline compound are different compounds of formula

wherein:
[A] is at least one cation;
[M] is at least one metal or metalloid cation;
[X] is at least one anion;
a is an integer from 1 to 6;
b is an integer from 1 to 6; and
c is an integer from 1 to 18.

The invention also provides the use of a luminescent material as a phosphor in a light emitting device, which luminescent material comprises:
one or more matrix materials, and, disposed in said one or more matrix materials,
a first plurality of nanoparticles comprising a first crystalline compound, and
a second plurality of nanoparticles comprising a second crystalline compound,
wherein the first crystalline compound and the second crystalline compound are different compounds of formula

wherein:
[A] is at least one cation;
[M] is at least one metal or metalloid cation;
[X] is at least one anion;
a is an integer from 1 to 6;
b is an integer from 1 to 6; and
c is an integer from 1 to 18.

Also provided by the invention is a luminescent material comprising one or more matrix materials and disposed in said matrix materials:
a first plurality of nanoparticles comprising a first crystalline compound; and
(ii) a second plurality of nanoparticles comprising a second crystalline compound,
wherein said first and second crystalline compounds are different compounds of formula:

wherein:
[A] is at least one cation;
[M] is at least one metal or metalloid cation;
[X] is at least one anion;
a is an integer from 1 to 6;
b is an integer from 1 to 6; and
c is an integer from 1 to 18.

The invention further provides a process for producing a light emitting device comprising a phosphor, which process comprises disposing a luminescent material as defined herein on a light source as defined herein.

The invention also provides a process for producing a luminescent material, which process comprises combining a first plurality of nanoparticles comprising a first crystalline compound, a second plurality of nanoparticles comprising a second crystalline compound and one or more matrix materials, wherein said first and second crystalline compounds are different compounds of formula $[A]_a[M]_b[X]_c$, wherein: [A] is at least one cation; [M] is at least one metal or metalloid cation; [X] is at least one anion; a is an integer from 1 to 6; b is an integer from 1 to 6; and c is an integer from 1 to 18.

DETAILED DESCRIPTION OF THE INVENTION

Definitions

Figure 1:
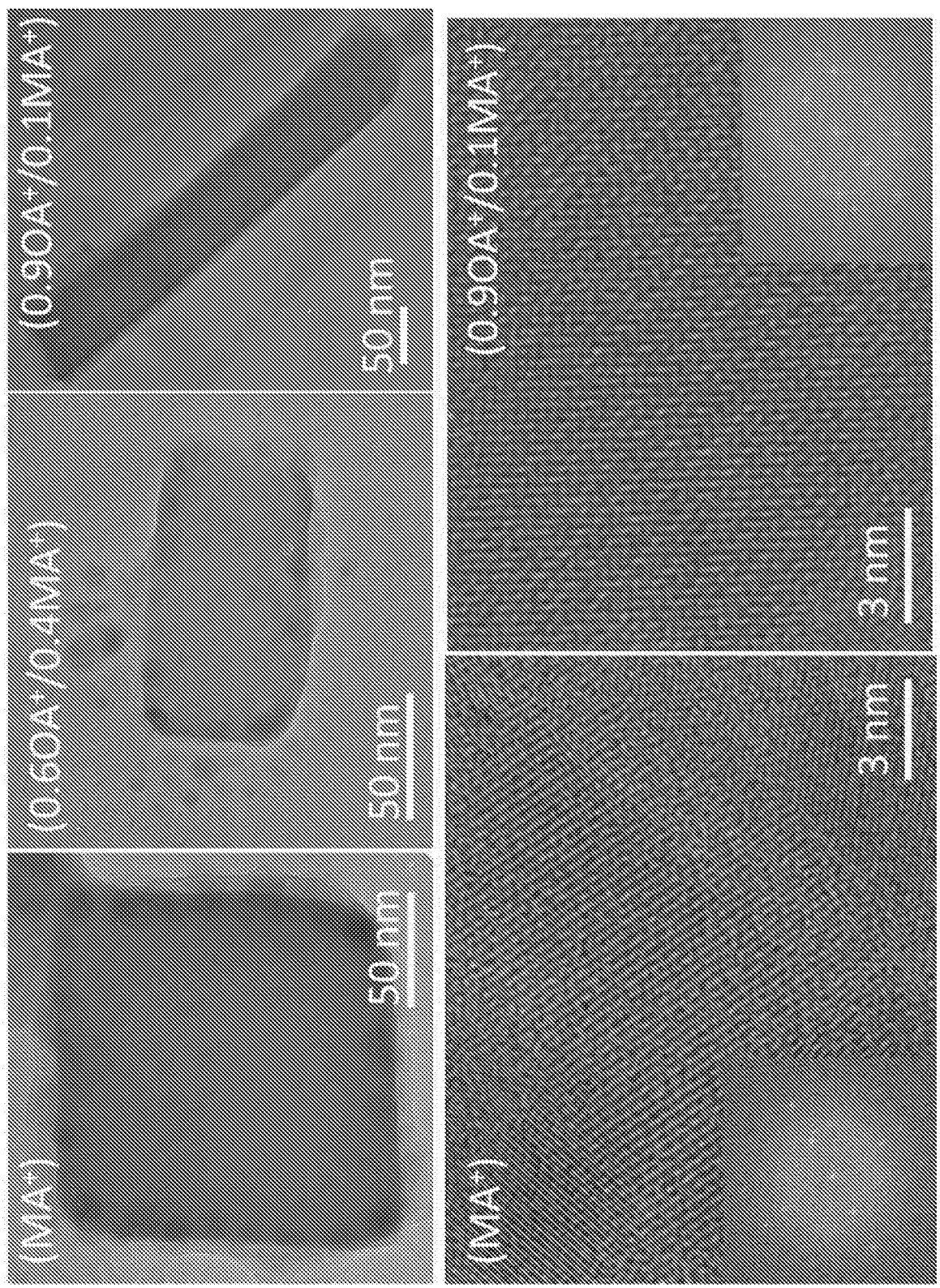
FIG. 1 shows transmission electron micrographs of (MA/OA)PbBr$_3$ perovskite NCs with varying OA$^+$/MA$^+$ molar ratios.

The term "perovskite", as used herein, refers to a material with a crystal structure related to that of $CaTiO_3$ or a material comprising a layer of material, which layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. The skilled person will appreciate that a perovskite material can be represented by the formula $[A][B][X]_3$, wherein [A] is at least one cation, [B] is at least one cation and [X] is at least one anion. When the perovskite comprise more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$.

The term "metal halide perovskite", as used herein, refers to a perovskite, the formula of which contains at least one metal cation and at least one halide anion. The term "organic-inorganic metal halide perovskite", as used herein, refers to a metal halide perovskite, the formula of which contains at least one organic cation.

The term "hexahalometallate", as used herein, refers to a compound which comprises an anion of the formula $[MX_6]^{n-}$ wherein M is a metal atom, each X is independently a halide anion and n is an integer from 1 to 4.

The term "chalcogenide" refers to an anion of the elements of group 16, for instance $O^{2-}$, $S^{2-}$, $Se^{2-}$, or $Te^{2-}$. Typically, the chalcogenides are taken to be $S^{2-}$, $Se^{2-}$, and $Te^{2-}$.

The term "monocation", as used herein, refers to any cation with a single positive charge, i.e. a cation of formula $A^+$ where A is any moiety, for instance a metal atom or an organic moiety. The term "dication", as used herein, refers to any cation with a double positive charge, i.e. a cation of formula $A^{2+}$ where A is any moiety, for instance a metal atom or an organic moiety. The term "tetracation", as used herein, refers to any cation with a quadruple positive charge, i.e. a cation of formula $A^{4+}$ where A is any moiety, for instance a metal atom.

The term "alkyl", as used herein, refers to a linear or branched chain saturated hydrocarbon radical. An alkyl group may be a $C_{1-20}$ alkyl group, a $C_{1-14}$ alkyl group, a $C_{1-10}$ alkyl group, a $C_{1-6}$ alkyl group or a $C_{1-4}$ alkyl group. Examples of a $C_{1-10}$ alkyl group are methyl, ethyl, propyl, butyl, pentyl, hexyl, heptyl, octyl, nonyl or decyl. Examples of $C_{1-6}$ alkyl groups are methyl, ethyl, propyl, butyl, pentyl or hexyl. Examples of $C_{1-4}$ alkyl groups are methyl, ethyl, i-propyl, n-propyl, t-butyl, s-butyl or n-butyl. If the term "alkyl" is used without a prefix specifying the number of carbons anywhere herein, it has from 1 to 6 carbons (and this also applies to any other organic group referred to herein). An alkyl group is typically unsubstituted.

The term "aryl", as used herein, refers to a monocyclic, bicyclic or polycyclic aromatic ring which contains from 6 to 14 carbon atoms, typically from 6 to 10 carbon atoms, in the ring portion. Examples include phenyl, naphthyl, indenyl, indanyl, anthrecenyl and pyrenyl groups.

The term "substituted", as used herein in the context of substituted organic groups, refers to an organic group which bears one or more substituents selected from $C_{1-10}$ alkyl, aryl (as defined herein), cyano, amino, nitro, $C_{1-10}$ alkylamino, di($C_{1-10}$)alkylamino, arylamino, diarylamino, aryl($C_{1-10}$)alkylamino, amido, acylamido, hydroxy, oxo, halo, carboxy, ester, acyl, acyloxy, $C_{1-10}$ alkoxy, aryloxy, halo($C_{1-10}$)alkyl, sulfonic acid, thiol, $C_{1-10}$ alkylthio, arylthio, sulfonyl, phosphoric acid, phosphate ester, phosphonic acid and phosphonate ester. Examples of substituted alkyl groups include haloalkyl, perhaloalkyl, hydroxyalkyl, aminoalkyl, alkoxyalkyl and alkaryl groups. When a group is substituted, it may bear 1, 2 or 3 substituents. For instance, a substituted group may have 1 or 2 substituents.

Light Emitting Device

The invention provides a light emitting device comprising a light source and a luminescent material, which luminescent material comprises: one or more matrix materials, and, disposed in said one or more matrix materials, a first plurality of nanoparticles comprising a first crystalline compound, and a second plurality of nanoparticles comprising a second crystalline compound, wherein the first crystalline compound and the second crystalline compound are different compounds of formula $[A]_a[M]_b[X]_c$, wherein: [A] is at least one cation; [M] is at least one metal or metalloid cation; [X] is at least one anion; a is an integer from 1 to 6; b is an integer from 1 to 6; and c is an integer from 1 to 18.

[X] is typically at least one halide anion or chalcogenide ion selected from $S^{2-}$, $Se^{2-}$, and $Te^{2-}$. Preferably, [X] is typically at least one halide anion.

A light emitting device is an electronic device which emits light. Examples of a light emitting device include a light emitting diode (LED), an organic light emitting diode (OLED), a light emitting electrochemical cell, an incandescent light bulb, a halogen light bulb, a noble gas light (for instance a neon, argon or krypton light), a cathode ray tube, a carbon arc lamp and a laser. The light emitting device is typically a light emitting diode.

The light source may have a peak emission wavelength of from 300 nm to 800 nm. As discussed above, the luminescent materials of the invention are useful in producing white light from bluer light. Thus, the light source often has a peak emission wavelength of from 350 nm to 600 nm or from 400 nm to 500 nm. For instance, the light source may have a peak emission wavelength of from 450 nm to 500 nm. Peak emission wavelengths of light sources are readily available to the skilled person.

The light source is the material or article which emits the light which emanates from the light emitting device. Typically, the light source is a light emitting diode. Thus the light emitting device maybe a light emitting diode comprising said light emitting diode as a light source and the luminescent material. The light source may for instance be an inorganic LED or an organic LED. The LED may comprise, as a semiconductor, gallium(III) nitride (GaN), gallium(III) phosphide (GaP), aluminium gallium indium phosphide (AlGaInP), aluminium gallium phosphide (AlGaP), indium gallium nitride (InGaN) or silicon (Si). A commonly used blue LED is a gallium nitride (GaN). Typically, the light source is a light emitting diode comprising gallium nitride.

A luminescent material is a material which emits light following the absorption of photons, i.e. a phosphorescent or fluorescent material. The luminescent material used in the device of the invention may be fluorescent, phosphorescent or both. The luminescent material may be in the form of a layer or a coating. The luminescent material acts as a phosphor by absorbing light emitted from the light source and re-emitting the light at a difference wavelength. Thus, the luminescent material is typically positioned between the light source and an outer surface of the light emitting device. For instance, if the light emitting device is a light emitting diode, the luminescent material is typically present as a coating on the transparent housing of the light emitting diode.

The luminescent material may be present as a layer having a thickness of from 100 nm to 4 mm, for instance from 1 µm to 1000 µm or from 50 µm to 500 µm. In some cases the layer may have a thickness of from 1 to 4 mm, for instance if a free-standing layer is to be constructed. If the luminescent material comprises two or more layers each respectively comprising different nanoparticles, the thickness of each layer may be from 100 nm to 4 mm, for instance from 1 µm to 1000 µm or from 50 µm to 500 µm.

The first and second crystalline compounds in the luminescent material may be any suitable luminescent crystalline compounds. A crystalline compound is a compound having an extended 3D crystal structure. A crystalline compound is typically in the form of crystals or crystallites (i.e. a plurality of crystals having particle sizes of less than or equal to 1 µm). Nanoparticles, as defined herein, are typically particles having a particle size of from 1 to 1000 nm, for instance from 1 to 500 nm, or from 5 to 100 nm. Particle size is the diameter of a spherical particle having the same volume as the particle in question.

The first and/or second crystalline compound is typically a compound of formula $[A]_a[M]_b[X]_c$, wherein: [A] is at least one monocation or dication; [M] is at least one metal or metalloid cation; [X] is at least one halide anion; a is an integer from 1 to 3, b is an integer from 1 to 3, and c is an integer from 1 to 8. a is often 1 or 2. b is often 1 or 2. c is often from 3 to 6.

For instance, if [A] is one cation (A), [M] is two cations ($M^1$ and $M^2$), and [X] is one anion (X), the crystalline material may comprise a compound of formula $A_a(M^1,M^2)_bX_c$. For instance, if [A] is one cation (A), [M] is one cation (M), and [X] is two anions ($X^1$ and $X^2$), the crystalline material may comprise a compound of formula $A_aM_b(X^1,X^2)_c$. [X] may represent one, two or more X ions. If [A], [M] or [X] is more than one ion, those ions may be present in any proportion. For instance, $A_a(M^1,M^2)_bX_c$ includes all compounds of formula $A_aM^1{}_{by}M^2{}_{b(1-y)}X_c$ wherein y is between 0 and 1, for instance from 0.05 to 0.95. Such materials may be referred to as mixed ion materials.

The first crystalline compound may for instance have the formula $$[A]_a[M]_b[X]_c$$

wherein:
[A] is one or more cations such as those described herein, for instance one or more organic monocations;
[M] is one or more first cations which are metal or metalloid cations selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, $Te^{4+}$, $Bi^{3+}$, $Sb^{3+}$, $Sn^{2+}$, $Pb^{2+}$, $Cu^{2+}$, $Ge^{2+}$ and $Ni^{2+}$;
[X] is one or more second anions selected from $Cl^-$, $Br^-$, $I^-$, $S^{2-}$, $Se^{2-}$, and $Te^{2-}$;
a is an integer from 1 to 3;
b is an integer from 1 to 3; and
c is an integer from 1 to 8.

Typically, the first and/or second crystalline compound is a perovskite compound which comprises at least one monocation, at least one metal or metalloid dication and at least one halide anion. The first and/or second crystalline compound is often a metal halide perovskite, and preferably an organic-inorganic metal halide perovskites. For instance, the luminescent material may comprise a first plurality of nanoparticles comprising a (first) metal halide perovskite and a second plurality of nanoparticles comprising a (second) metal halide perovskite.

Preferably, the first crystalline compound is a perovskite compound of formula (I):

$$[A][M][X]_3 \quad \text{(I)}$$

wherein: [A] is at least one monocation; [M] is at least one metal or metalloid dication; and [X] is at least one halide anion. The second crystalline compound is also preferably a different perovskite compound of formula (I):

$$[A][M][X]_3 \quad \text{(I)}$$

wherein: [A] is at least one monocation; [M] is at least one metal or metalloid dication; and [X] is at least one halide anion.

The first and/or second crystalline compound is often a perovskite compound of formula (II):

$$[A]M[X]_3 \quad \text{(II)}$$

wherein: [A] is two or more monocations; M is a single metal or metalloid dication; and [X] is at least one halide anion.

Often, the first and/or second crystalline compound is a layered perovskite compound of formula (IIa):

$$[A]_2[M][X]_4 \quad \text{(IIa)}$$

wherein: [A] is at least one monocation; [M] is at least one metal or metalloid dication; and [X] is at least one halide anion. For instance, the first and/or second crystalline compound may be a layered perovskite compound of formula (IIb):

$$[A]_2M[X]_4 \quad \text{(IIb)}$$

wherein: [A] is at least one monocation; M is a single metal or metalloid dication; and [X] is at least one halide anion. For instance, the first and second crystalline compounds may be different layered perovskite compounds of formula (IIb).

Typically, each monocation is independently selected from $Rb^+$, $Cs^+$, $(NR^1R^2R^3R^4)^+$, $(R^1R^2N=CR^3R^4)^+$, $(R^1R^2N-C(R^5)=NR^3R^4)^+$ and $(R^1R^2N-C(NR^5R^6)=NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group. Typically, each of $R^1$, $R^2$, $R^3$, $R^4$, $R^5$ and $R^6$ is independently H, an unsubstituted $C_{1-10}$ alkyl group or phenyl.

Thus, [A] may be one or more cations selected from inorganic cations (for instance $Rb^+$ and $Cs^+$) and/or one or more cations selected from inorganic cations (for instance $(NR^1R^2R^3R^4)^+$, $(R^1R^2N=CR^3R^4)^+$, $(R^1R^2N—C(R^5)=NR^3R^4)^+$ and $(R^1R^2N—C(NR^5R^6)=NR^3R^4)^+$). [A] is often one or more organic cations selected from $(CH_3NH_3)^+$, $(CH_3(CH_2)_7NH_3)^+$, $(H_2N—CH=NH_2)^+$ and $(H_2N—C(NH_2)=NH_2)^+$.

For instance, each monocation may independently selected from cations of formula $(R^1NH_3)^+$, wherein $R^1$ is substituted or unsubstituted $C_{1-10}$ alkyl, for instance methyl, ethyl, hexyl, heptyl, octyl, nonyl, decyl, benzyl or phenylethyl. Preferably, each monocation is independently selected from cations of formula $(R^1NH_3)^+$, wherein $R^1$ is unsubstituted $C_{1-10}$ alkyl. More preferably, each monocation is independently selected from cations of formula $(R^1NH_3)^+$, wherein $R^1$ is unsubstituted methyl or ethyl. In a layered perovskite, each monocation is often independently selected from cations of formula $(R^1NH_3)^+$, wherein $R^1$ is unsubstituted $C_{4-20}$ alkyl, for instance unsubstituted $C_{10-18}$ alkyl.

The first and/or second crystalline compound may for instance be a mixed cation perovskite compound of formula (II):

$$[A]M[X]_3 \qquad (II)$$

wherein: [A] is two or more organic cations of formula $(R^1NH_3)^+$, wherein $R^1$ is substituted or unsubstituted $C_{1-10}$ alkyl; M is a single metal or metalloid dication; and [X] is at least one halide anion. $R^1$ may be selected from methyl, ethyl, hexyl, heptyl octyl.

The first and/or second crystalline compound may alternatively be an inorganic perovskite compound of formula (II):

$$[A]M[X]_3 \qquad (II)$$

wherein: [A] is one or more inorganic cations (e.g. $Cs^+$ or $Rb^+$); M is a single metal or metalloid dication; and [X] is at least one halide anion.

Typically, each metal or metalloid dication is independently selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Preferably, each metal or metalloid dication is independently selected $Ge^{2+}$, $Sn^{2+}$, $Pb^{2+}$ and $Cu^{2+}$. More preferably, the metal or metalloid cation is $Pb^{2+}$.

Typically, each halide anion is independently selected from $F^-$, $Cl^-$, $Br^-$ and $I^-$. Preferably, each halide anion is independently selected from $Cl^-$, $Br^-$ and $I^-$, for instance $Cl^-$ or $Br^-$.

In some preferred embodiments, the first and/or second crystalline compound is selected from perovskite compounds of formula $CH_3NH_3MX_3$, $CH_3NH_3MX_xX'_{3-x}$, $(CH_3NH_3)_{1-y}(C_8H_{17}NH_3)_{1-y}MX_3$ and $(CH_3NH_3)_{1-y}(C_8H_{17}NH_3)_{1-y}MX_xX'_{3-x}$, wherein M is $Cu^{2+}$, $Pb^{2+}$, $Ge^{2+}$ or $Sn^{2+}$, X is a halide anion which is $F^-$, $Cl^-$, $Br^-$ or $I^-$, X' is different from X and is a halide anion which is $F^-$, $Cl^-$, $Br^-$ or $I^-$, x is from 0 to 3, and y is from 0 to 1.

y may for instance be from 0.2 to 0.8. x is typically 0, 3 or from 0.5 to 2.5.

For instance, the first and/or second crystalline compound may be a perovskite compound of formula $(CH_3NH_3)_{1-y}(C_8H_{17}NH_3)_{1-y}MX_3$ or $(CH_3NH_3)_{1-y}(C_8H_{17}NH_3)_{1-y}MX_xX'_{3-x}$, wherein M is $Cu^{2+}$, $Pb^{2+}$, $Ge^{2+}$ or $Sn^{2+}$, X is a halide anion which is $F^-$, $Cl^-$, $Br^-$ or $I^-$, X' is different from X and is a halide anion which is $F^-$, $Cl^-$, $Br^-$ or $I^-$, x is from 0 to 3, and y is from 0.5 to 0.7, preferably from 0.55 to 0.65.

Typically in the crystalline compound each halide anion is independently $Br^-$, $I^-$ or $Cl^-$.

For example, the first and/or second crystalline compound may be a perovskite compound selected from $CH_3NH_3PbI_3$, $CH_3NH_3PbBr_3$, $CH_3NH_3PbCl_3$, $CH_3NH_3PbF_3$, $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnI_3$, $CH_3NH_3SnBr_3$, $CH_3NH_3SnCL_3$, $CH_3NH_3SnF_3$, $CH_3NH_3SnBrI_2$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, $CH_3NH_3CuI_3$, $CH_3NH_3CuBr_3$, $CH_3NH_3CuCl_3$, $CH_3NH_3CuF_3$, $CH_3NH_3CuBrI_2$, $CH_3NH_3CuBr_xI_{3-x}$, $CH_3NH_3CuBr_xCl_{3-x}$, $CH_3NH_3CuF_{3-x}Br_x$, $CH_3NH_3CuI_xBr_{3-x}$, $CH_3NH_3CuI_xCl_{3-x}$, $CH_3N_3CuF_{3-x}I_x$, $CH_3NH_3Cl_xBr_{3-x}$, $CH_3NH_3CuI_{3-x}Cl_x$, and $CH_3NH_3CuF_{3-x}Cl_x$ where x is from 0 to 3. x may be from 0.05 to 2.95. For instance, x may be from 0.1 to 2.9, or from 0.5 to 2.5. In some cases, x is from 0.75 to 2.25, or from 1 to 2. The first crystalline compound may for instance be a perovskite compound selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$.

For example, the first and/or second crystalline compound may be a perovskite compound selected from $(CH_3NH_3)_{1-y}(C_8H_{17}NH_3)_{1-y}PbI_3$, $(CH_3NH_3)_{1-y}(C_8H_{17}NH_3)_{1-y}PbBr_3$, $(CH_3NH_3)_{1-y}(C_8H_{17}NH_3)_{1-y}PbCl_3$, $(CH_3NH_3)_{1-y}(C_8H_{17}NH_3)_{1-y}PbF_3$, $(CH_3NH_3)_{1-y}(C_8H_{17}NH_3)_{1-y}PbBr_xI_{3-x}$, $(CH_3NH_3)_{1-y}(C_8H_{17}NH_3)_{1-y}PbBr_xCl_{3-x}$, $(CH_3NH_3)_{1-y}(C_8H_{17}NH_3)_{1-y}PbI_xBr_{3-x}$, $(CH_3NH_3)_{1-y}(C_8H_{17}NH_3)_{1-y}PbI_xCl_{3-x}$, $(CH_3NH_3)_{1-y}(C_8H_{17}NH_3)_{1-y}PbCl_xBr_{3-x}$ and $(CH_3NH_3)_{1-y}(C_8H_{17}NH_3)_yPbI_{3-x}Cl_x$, where y is from 0.01 to 0.9, for instance from 0.3 to 0.7.

In some embodiments, the first and/or second crystalline compound is a hexahalometallate compound. Thus, the first and/or second crystalline compound may for instance be a hexahalometallate compound which comprises at least one monocation, at least one metal or metalloid tetracation and at least one halide anion.

The first and/or second crystalline compound may for instance be a hexahalometallate compound of formula (III):

$$[A]_2[M][X]_6 \qquad (III)$$

wherein: [A] is at least one monocation; [M] is at least one metal or metalloid tetracation; and [X] is at least one halide anion.

Typically, each monocation is independently selected from $Rb^+$, $Cs^+$, $(NR^1R^2R^3R^4)^+$, $(R^1R^2N=CR^3R^4)^+$, $(R^1R^2N-C(R^5)=NR^3R^4)^+$ and $(R^1R^2N—C(NR^5R^6)=NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group. Each of $R^1$, $R^2$, $R^3$, $R^4$, $R^5$ and $R^6$ is typically independently H, an unsubstituted $C_{1-10}$ alkyl group or phenyl. Preferably, each monocation is independently selected from cations of formula $(NR^1_4)^+$ and $(R^1NH_3)^+$ wherein $R^1$ is unsubstituted $C_{1-10}$ alkyl. For instance, in the hexahalometallate, [A] may be a single monocation which is $N(CH_3)_4^+$ or $NH_3(CH_3)^+$.

Typically, each metal or metalloid tetracation is selected from $Ti^{4+}$, $V^{4+}$, $Mn^{4+}$, $Fe^{4+}$, $Co^{4+}$, $Zr^{4+}$, $Nb^{4+}$, $Mo^{4+}$, $Ru^{4+}$, $Rh^{4+}$, $Pd^{4+}$, $Hf^{4+}$, $Ta^{4+}$, $W^{4+}$, $Re^{4+}$, $Os^{4+}$, $Ir^{4+}$, $Pt^{4+}$, $Sn^{4+}$, $Pb^{4+}$, $Po^{4+}$, $Si^{4+}$, $Ge^{4+}$, and $Te^{4+}$. More typically, each metal or metalloid tetracation is independently selected from $Sn^{4+}$, $Pb^{4+}$, $Ge^{4+}$ and $Te^{4+}$. Preferably, the metal or metalloid tetracation is $Sn^{4+}$ or $Pb^{4+}$.

In the hexahalometallate, each halide anion is typically independently selected from $Cl^-$, $Br^-$ and $I^-$.

It has been found that the properties of the nanoparticles can be improved by adding a long chain alkylamine or alkylammonium halide. Thus, the nanoparticles may further comprise a $C_{4-16}$ alkyl amine or a $C_{4-16}$ alkyl ammonium halide. In some cases, the nanoparticles forming the first and/or second plurality of nanoparticles further comprise an unsubstituted $C_{4-16}$ alkyl ammonium halide. The unsubstituted $C_{4-16}$ alkyl ammonium halide is often an octylammonium halide, for instance octylammonium iodide, bromide or chloride. The amount of the $C_{4-16}$ alkyl ammonium halide is typically from 0.1 to 1.0 mol %, for instance from 0.4 to 0.8 mol %, relative to the at least one cation (e.g. $(CH_3NH_3)^+$) in crystalline compound. Preferably, the amount of the $C_{4-16}$ alkyl ammonium may be from 10 to 90 mol %, for instance from 30 to 90 mol %, from 40 to 80 mol %, or from 50 to 70 mol %, relative to the at least one cation in crystalline compound. The long chain alkylamine or alkylammonium halide may be dispersed within the nanoparticles or, preferably, may form a shell around the nanoparticles.

The second crystalline compound may be as defined herein for the first crystalline compound. Thus, the second crystalline compound is often a perovskite compound of formula (I):

[A][M][X]$_3$                     (I)

wherein: [A] is at least one monocation; [M] is at least one metal or metalloid dication; and [X] is at least one halide anion.

The second crystalline compound is often a perovskite compound of formula (II):

[A]M[X]3                     (II)

wherein: [A] is two or more monocations; M is a single metal or metalloid dication; and [X] is at least one halide anion.

Often, the second crystalline compound is a layered perovskite compound of formula (IIa):

[A]$_2$[M][X]$_4$                     (IIa)

wherein: [A] is at least one monocation; [M] is at least one metal or metalloid dication; and [X] is at least one halide anion. For instance, the second crystalline compound may be a layered perovskite compound of formula (IIb):

[A]$_2$M[X]$_4$                     (II)

wherein: [A] is at least one monocation; M is a single metal or metalloid dication; and [X] is at least one halide anion.

For instance, the first and second crystalline compounds are often different mixed cation perovskite compounds of formula (II):

[A]M[X]$_3$                     (II)

wherein: [A] is two or more organic cations of formula $(R^1NH_3)^+$, wherein $R^1$ is substituted or unsubstituted $C_{1-10}$ alkyl; M is a single metal or metalloid dication; and [X] is at least one halide anion. $R^1$ may be selected from methyl, ethyl, hexyl, heptyl octyl.

Preferably, the first and second crystalline compounds are different perovskite compounds of formula (I):

[A][M][X]$_3$                     (I)

wherein: [A] is at least one organic monocation; [M] is at least one metal or metalloid dication; and [X] is at least one halide anion, and the nanoparticles of the first and second crystalline compounds further comprise a $C_{4-16}$ alkyl amine or a $C_{4-16}$ alkyl ammonium halide. The $C_{4-16}$ alkyl amine or a $C_{4-16}$ alkyl ammonium halide typically acts as a ligand and forms a coating on the nanoparticles.

The nanoparticles typically have a particle size of from 1 to 500 nm. Preferably the nanoparticles have a particle size of from 2 to 150 nm, more preferably 4 to 50 nm. For instance the first and second pluralities of nanoparticles may have a particle size of from 5 to 30 nm. Particle size is a well known term and refers (i) for a spherical particle, to the diameter of that spherical particle and (ii) for a non-spherical particle, to the diameter of a spherical particle having the same diameter as that non-spherical particle.

The first plurality of nanoparticles and the second plurality of nanoparticles may take a number of different shapes. Often, some of the nanoparticles (e.g. greater than 50 wt % of the total nanoparticles) have an elongated shape, for instance a shape representing either a flattened rectangle or a rod. Thus, some of the particles may have a maximum length which is 50% greater than their minimum width. For instance, in the first and/or second plurality of nanoparticles, the nanoparticles may have a length of from 200 nm to 800 nm and a width of from 40 nm to 200 nm. For instance, the first and second plurality of nanoparticles may have a sphericity of less than or equal to 0.8, or less than or equal to 0.6.

Typically, the first plurality of nanoparticles has a maximum photoluminescent emission of from 400 to 800 nm, preferably from 500 to 700 nm. The first plurality of nanoparticles may for instance have a maximum photoluminescent emission of from 500 to 575 nm and the second plurality of nanoparticles may have a maximum photoluminescent emission of from 575 to 650 nm.

The first (and second) plurality of nanoparticles are disposed in the one or more matrix materials. A matrix material is any suitable material in which a plurality of nanoparticles can be suspended. The matrix material is typically solid. The matrix material is typically non-reactive in that it does not undergo a chemical reaction with the nanoparticles or any other part of the light emitting device (e.g. a metal component). The matrix material typically has a high transparency to light across a large proportion of the visible spectrum.

The matrix material may be an inorganic material or an organic material. The matrix material is usually stable at temperatures up to 150° C. or up to 100° C. Typically, the matrix material comprises a polymeric matrix material. A polymeric matrix material is a matrix material comprising a polymer. The polymeric matrix material typically comprises a polymer which is a polyalkene (e.g. polyethene, polypropene, polybutene, polymethylmethacrylate or polystyrene), a polyester (e.g. polyethylene terephthalate, polyhydroxybutyrate or polyethylene apidate), a polyurethane, a polycarbonate, a polyimide, a polyamide (e.g. polyamide 6 or polyamide 66), or an epoxy resin. Preferably, the polymeric matrix material comprises a polymer selected from polymethylmethacrylate, polystyrene, polyurethane, a polycarbonate and a polyimide.

The concentration of the first (second) plurality of nanoparticles in the matrix material is typically from 0.1 to 80 wt % relative to the combined weight of the matrix materials and first (second) plurality of nanoparticles. The concentration may for instance be from 1 to 40 wt %, or from 5 to 30 wt %.

As discussed above, the use of nanoparticles of a crystalline material allows for the production of luminescent materials having a broad emission spectrum, particularly when a number of different types of crystalline compounds are used. For instance, in the light emitting device, the luminescent material may comprise nanoparticles of from two to ten different crystalline compounds as defined herein, for instance nanoparticles of three, four or five different crystalline compounds.

The one or more matrix materials may be the same or different. Typically, the one or more matrix materials comprise one or more polymeric matrix materials, optionally wherein the one or more polymeric matrix materials are as defined above or selected from polymethylmethacrylate, polystyrene, polyurethane, a polycarbonate, a polyimide, a polyamide or an epoxy resin.

A luminescent material containing two or more pluralities of nanoparticles can either be essentially homogenous in that the two or more pluralities of nanoparticles are intermixed with each other or it can have a laminate structure comprising layers of matrix materials with one or more types of nanoparticles disposed therein.

Typically, the luminescent material comprises: (a) a first layer comprising greater than 60 wt % of the first plurality of nanoparticles; and (b) a second layer comprising greater than 60 wt % of the second plurality of nanoparticles. Thus, the luminescent material may comprise a region which defines a first layer, and which region comprises 60 wt % of the total number of the first plurality of nanoparticles present in the luminescent material and a region which defines a second layer, and which region comprises 60 wt % of the total number of the second plurality of nanoparticles present in the luminescent material. In some cases, the luminescent material comprises: (a) a first layer comprising greater than 80 wt % of the first plurality of nanoparticles; and (b) a second layer comprising greater than 80 wt % of the second plurality of nanoparticles.

Thus, of the total mass (i.e. of the 100 wt %) of the first plurality of nanoparticles, 60 wt % of those first plurality of nanoparticles may be in the first layer. This does not mean that the first layer comprises 60 wt % or greater of nanoparticles and 40 wt % or less of matrix material, but rather that of the total mass of the first plurality of nanoparticles in the luminescent material as a whole, at least 60 wt % of those first nanoparticles are in the first layer (and consequently that at most 40% of those first nanoparticles are in the second layer).

In some embodiments, the luminescent material is formed from a plurality of layers. Thus, the first plurality of nanoparticles may form a first layer and the second plurality of nanoparticles may form a second layer. For instance, the luminescent material may comprise (a) a first layer comprising a matrix material and, disposed in the matrix material, the first plurality of nanoparticles and (b) a second layer comprising a matrix material and, disposed in the matrix material, the second plurality of nanoparticles. Often, the first layer comprises less than 5 wt %, or less than 2 wt %, of the second plurality of nanoparticles and the second layer comprises less than 5 wt %, or less than 2 wt %, of the first plurality of nanoparticles.

When the luminescent material comprises a first layer and a second layer, the first and second layer may be in direct contact or there may be an auxiliary layer between them, for instance a layer consisting essentially of a matrix material or a layer comprising an adhesive. Often, first and second layers are formed in direct contact.

Alternatively, the first plurality of nanoparticles and the second plurality of nanoparticles are mutually interspersed within the matrix materials. Thus, the luminescent material may be formed by blending the first and second pluralities of nanoparticles in one or more matrix materials.

The second crystalline compound may be as defined for the first crystalline compound herein. The first crystalline compound and second crystalline compound are different crystalline compounds.

Preferably, the first crystalline compound and the second crystalline compound are each different perovskite compounds of formula (I):

[A][M][X]$_3$     (I)

wherein: [A] is at least one monocation; [M] is at least one metal or metalloid dication; and [X] is at least one halide anion.

[A], [M] and [X] may be as defined above. Often, the first crystalline compound and the second crystalline compound are each different organic-inorganic metal halide perovskite compounds of formula (I).

For instance, the first and second crystalline compounds may be different perovskite compounds selected from $CH_3NH_3PbI_3$, $CH_3NH_3PbBr_3$, $CH_3NH_3PbCl_3$, $CH_3NH_3PbF_3$, $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3N_3SnI_xCl_{3-x}$, $CH_3Nh_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, $CH_3NH_3CuI_3$, $CH_3NH_3CuBr_3$, $CH_3NH_3CuCl_3$, $CH_3NH_3CuF_3$, $CH_3NH_3CuBrI_2$, $CH_3NH_3CuBr_xI_{3-x}$, $CH_3NH_3CuBr_xCl_{3-x}$, $CH_3NH_3CuF_{3-x}Br_x$, $CH_3NH_3CuI_xBr_{3-x}$, $CH_3NH_3CuI_xCl_{3-x}$, $CH_3NH_3CuF_3I_x$, $CH_3NH_3CuCl_xBr_{3-x}$, $CH_3NH_3CuI_{3-x}Cl_x$, and $CH_3NH_3CuF_{3-x}Cl_x$ where x is from 0 to 3. x may be from 0.05 to 2.95. For instance, x may be from 0.1 to 2.9, or from 0.5 to 2.5. In some cases, x is from 0.75 to 2.25, or from 1 to 2.

Often, the first and second crystalline compounds are different perovskite compounds selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$. The first and/or second plurality of nanoparticles may further comprise an unsubstituted $C_{4-16}$ alkyl ammonium halide. The unsubstituted $C_{4-16}$ alkyl ammonium halide is often an octylammonium halide, for instance octylammonium iodide, bromide or chloride. The alklyammonium halide may act as a ligand which forms a shell around each of the nanoparticles.

The first crystalline compound may be $CH_3NH_3PbBr_3$ and the second crystalline compound may be $CH_3NH_3PbBrI_2$ or $CH_3NH_3PbI_3$.

In some embodiments, the first and second crystalline compounds are different perovskite compounds of formula $Cs[M][X]_3$ or $Rb[M][X]_3$, where [M] is at least one metal or metalloid dication as defined herein; and [X] is at least one halide anion as defined herein. For instance, the the first and second crystalline compounds are different perovskite compounds of formula $CsPbX_3$ or $RbPbX_3$. In this case, the nanoparticles typically further comprise a further organic cation, for instance formamidinium, guanidinium, unsubstituted $C_{4-16}$ alkyl ammonium halide or phenylethylammonium. The unsubstituted $C_{4-16}$ alkyl ammonium halide is often an octylammonium halide, for instance octylammonium iodide, bromide or chloride. The alkylammonium halide may act as a ligand which forms a shell around each of the nanoparticles.

In order to obtain a broad emission spectrum, it is typically necessary that the two or more crystalline compounds have different maximum photoluminescent emission wavelengths. Often, the difference between the wavelength of the maximum photoluminescent emission of the first plurality of nanoparticles and the wavelength of the maximum photoluminescent emission of the second plurality of nanoparticles is greater than or equal to 50 nm. The difference may be greater than or equal to 100 nm or greater than or equal to 150 nm.

The maximum photoluminescent emission wavelength of a plurality of nanoparticles can easily be measured by the skilled person, for instance by performing photoluminescent emission spectroscopy. Nanoparticles of $CH_3NH_3PbBr_3$ have a maximum emission at about 520 nm, nanoparticles of $CH_3NH_3PbBrI_2$ have a maximum emission at about 678 nm and nanoparticles of $CH_3NH_3PbI_3$ have a maximum emission at about 775 nm.

For instance, the first plurality of nanoparticles may have a maximum photoluminescent emission wavelength of from 500 to 600 nm and the second plurality of nanoparticles may have a maximum photoluminescent emission wavelength of from 600 to 800 nm, for instance from 600 to 650 nm.

Typically, the first plurality of nanoparticles and the second plurality of nanoparticles have an average particle size of from 2 to 100 nm, for instance from 5 to 50 nm. The average particle size of the first and, if present, second plurality of nanoparticles may be from 10 to 30 nm. The particle size of a nanoparticle is the diameter of a spherical particle having the same volume as the nanoparticle. The average particle size of a plurality of nanoparticles is typically the mass average particle size and may for instance be measured by laser diffraction.

In some embodiments, the luminescent material further comprises a third plurality of nanoparticles comprising a third crystalline compound disposed in the matrix materials, which third crystalline compound is a compound of formula $[A]_a[M]_b[X]_c$, wherein: [A] is at least one cation; [M] is at least one metal or metalloid cation; [X] is at least one anion; a is an integer from 1 to 6; b is an integer from 1 to 6; and c is an integer from 1 to 18.

In further embodiments, the luminescent material further comprises a fourth plurality of nanoparticles comprising a fourth crystalline compound disposed in the matrix materials, which fourth crystalline compound is a compound of formula $[A]_a[M]_b[X]_c$, wherein: [A] is at least one cation; [M] is at least one metal or metalloid cation; [X] is at least one anion; a is an integer from 1 to 6; b is an integer from 1 to 6; and c is an integer from 1 to 18.

The third crystalline compound and/or the fourth crystalline compound may be as defined herein for the first crystalline compound. The first, second, third, and optionally fourth, crystalline compounds are all different crystalline compounds.

For instance, the first, second, third and optionally fourth crystalline compounds may be different perovskite compounds selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$.

For instance, the first crystalline compound may be $CH_3NH_3PbBr_3$, the second crystalline compound may be $CH_3NH_3PbBrI_2$, and the third crystalline compound may be $CH_3NH_3PbI_3$.

The third and, if present, fourth plurality of nanoparticles may be present as additional layers in the luminescent material or may be intermixed with the other nanoparticles.

Typically, the luminescent material comprises: (c) a third layer comprising greater than 60% of the third plurality of nanoparticles; and optionally (d) a fourth layer comprising greater than 60% of the fourth plurality of nanoparticles. The third layer may comprise greater than 80% of the third plurality of nanoparticles. The fourth layer may comprise greater than 80% of the fourth plurality of nanoparticles. The third and fourth layers may be as define above for the first and second layers.

Alternatively, in some cases the first plurality of nanoparticles, the second plurality of nanoparticles, the third plurality of nanoparticles, and optionally the fourth plurality of nanoparticles, are mutually interspersed in the matrix materials.

The nanoparticles useful in the invention may be produced by any suitable method. For instance a precursor solution comprising a first precursor compound and a second precursor compound may be injected into a solvent (i.e. a non-coordinating solvent such as toluene) leading to precipitation of NCs of the crystalline material. Perovskite NCs may be produced by using first precursor compound such as MAOI, MABr or MAI (where MA is methylammonium) and a second precursor such as $PbCl_2$, $PbBr_2$ or $PbI_2$. A precursor solution may be injected at 5 min intervals into anhydrous toluene under vigorous stirring. As soon as the precursor solution is injected in to the non-coordinating solvent (e.g. toluene), the perovskite precipitates out as nano-crystals (NCs).

To improve the stability of the crystalline compound NCs, oleic acid can also be added into the solvent (e.g. toluene). Typically from 20 mg to 60 mg of oleic acid is added in the 10 ml of the solvent (e.g. toluene) before the injection of the precursor solution.

Mixed alkyl lead halide perovskite (e.g $MA(OA)PbX_3$) NCs may be produced by the following method. A longer chain length alkyl group is added into the precursor solution. This is then injected to a solvent such as toluene to lead to precipitation of the NCs.

Injection of the precursor solution into a toluene-polymer matrix improves the mono-dispersion and stability of the colloidal NCs markedly.

The NCs can also be synthesised by a solid-state reaction. The first and second precursor compounds are mixed, and the mixture is ground and then annealed, for instance at 100° C. for 20 min. The grinding and annealing process may be repeated 5-6 times to achieve homogenous mixture of NCs. The as-synthesised NCs may then be dispersed in toluene/or toluene-polymer.

The dispersion of NCs in a solvent/polymer mixture may be disposed on a surface and heated to remove the solvent and leave a luminescent material comprising a polymer matrix with the NCs disposed therein.

Use

The invention also provides the use of a luminescent material as a phosphor in a light emitting device, which luminescent material comprises: one or more matrix materials, and, disposed in said one or more matrix materials, a first plurality of nanoparticles comprising a first crystalline compound, and a second plurality of nanoparticles comprising a second crystalline compound, wherein the first crystalline compound and the second crystalline compound are different compounds of formula $[A]_a[M]_b[X]_c$, wherein: [A] is at least one cation; [M] is at least one metal or metalloid cation; [X] is at least one anion; a is an integer from 1 to 6; b is an integer from 1 to 6; and c is an integer from 1 to 18.

A phosphor is a phosphorescent or fluorescent material which is used in light emitting devices to balance or change the colour of the light emitted by the device.

In the use of the invention, the light emitting device may be as further defined herein.

Luminescent Material

The invention provides a luminescent material comprising one or more matrix materials and disposed in said matrix materials:

a first plurality of nanoparticles comprising a first crystalline compound; and (ii) a second plurality of nanoparticles comprising a second crystalline compound, wherein said first and second crystalline compounds are different compounds of formula: $[A]_a[M]_b[X]_c$, wherein: [A] is at least one cation; [M] is at least one metal or metalloid cation; [X] is at least one anion; a is an integer from 1 to 6; b is an integer from 1 to 6; and c is an integer from 1 to 18.

The luminescent material may be as further defined herein. Typically, the first plurality of nanoparticles forms a first layer and the second plurality of nanoparticles forms a second layer. For instance, the luminescent material may comprise (a) a first layer comprising a matrix material and, disposed in the matrix material, the first plurality of nanoparticles and (b) a second layer comprising a matrix material and, disposed in the matrix material, the second plurality of nanoparticles. Often, the first layer comprises less than 5 wt %, or less than 2 wt %, of the second plurality of nanoparticles and the second layer comprises less than 5 wt %, or less than 2 wt %, of the first plurality of nanoparticles Process for Producing a Light Emitting Device The invention provides a process for producing a light emitting device comprising a phosphor, which process comprises disposing a luminescent material as defined herein on a light source as defined herein. The luminescent material thus typically forms the phosphor.

Disposing the luminescent material may comprises disposing a precursor solution comprising the luminescent material or disposing a solid layer of the precursor material.

Typically, the process comprises combining a first plurality of nanoparticles comprising a first crystalline compound, a second plurality of nanoparticles comprising a second crystalline compound and one or more matrix materials, wherein said first and second crystalline compounds are different compounds of formula $[A]_a[M]_b[X]_c$, wherein: [A] is at least one cation; [M] is at least one metal or metalloid cation; [X] is at least one anion; a is an integer from 1 to 6; b is an integer from 1 to 6; and c is an integer from 1 to 18.

Often, the luminescent material is a laminate material comprising a plurality of layers. Thus, the process typically comprises: (a) providing a first layer comprising a first matrix material and the first plurality of nanoparticles comprising a first crystalline compound; and (b) disposing on the first layer a second layer comprising a second matrix material and the second plurality of nanoparticles comprising a second crystalline compound.

The first and second matrix materials may be the same or different and may be as defined herein.

Disposing a layer comprising a matrix material and a plurality of nanoparticles comprising a crystalline compound typically comprises disposing a composition comprising a solvent, the plurality of nanoparticles and the matrix material and removing the solvent.

The solvent is typically an organic solvent such as acetonitrile, toluene, DMSO or acetone. Removing the solvent typically comprises heating the composition to remove the solvent. If the matrix material is a thermosetting polymer or curable polymer, disposing the layer may comprise simply disposing a composition comprising the plurality of nanoparticles and a precursor to the matrix material, and curing the precursor to the matrix material. The precursor to the matrix material may be a mixture of monomers or a polymer with a cross-linking agent.

In some embodiments, the process further comprises: (c) disposing on the second layer a third layer comprising a matrix material and a third plurality of nanoparticles comprising a third crystalline compound; and (d) optionally disposing on the third layer a fourth layer comprising a matrix material and a fourth plurality of nanoparticles comprising a fourth crystalline compound, wherein said third and fourth crystalline compounds are different compounds of formula $[A]_a[M]_b[X]_c$, wherein: [A] is at least one cation; [M] is at least one metal or metalloid cation; [X] is at least one anion; a is an integer from 1 to 6; b is an integer from 1 to 6; and c is an integer from 1 to 18.

The luminescent material may be as further defined herein.

The following Examples now describe the invention in more detail. The Examples are not to be considered to limit the invention.

EXAMPLES

Example 1—Tunable White Light Emission

Precursor Materials:

The commercially available lead source compounds (i.e. $PbCl_2$, $PbBr_2$ and $PbI_2$) and hydrogen halide acids (HCl, HBr⁻ and HI) were purchased from Sigma Aldrich. Methylamine ($CH_3NH_2$ 41%) and octylamine ($C_8H_{17}NH_2$) were also purchased from Sigma Aldrich and used without any further modification.

Synthesis of Alkyl-Ammonium-Halide:

Alkyl Ammonium Halide is Done in the Lab by Reacting alkyl amine (R=$CH_3NH_2$ and/or $C_8H_{17}NH_2$) and HX (i.e. HI, HBr and HCl). Methyl ammonium iodide was synthesised by reacting typically 24 ml of Methylamine 33 wt. % in ethanol with 10 ml of Hydriiodic acid (57% in $H_2O$) in 100 ml of $C_2H_5OH$. The reaction was carried out while vigorous stirring under ambient condition for 30-60 min. The reaction mixture was than subjected to rotary evaporator at 60° C. to remove the solvent, leading to the precipitation of a white/yellowish coloured methyl ammonium iodide (MAI) powder. The resulting product was then washed with diethylether several times to remove un-reacted reagents. The as-synthesised compound was then recrystallised with either $C_2H_5OH$ or $C_2H_5OH/CH_3OCH_3$ solvent and dried in a vacuum furnace at 60° C. for 4 hours in order to get a purified white colour $CH_3NH_3I$ (MAI) powder. Owing to its hygroscopic nature the purified MAI was stored under dry conditions. To synthesise MABr and MACl, a similar procedure was followed, except for the source of halide anions, where HBr and HCl were used respectively. OAI (octyl-ammonium-iodide), OABr (octyl-ammonium bromide) and OACl (octyl-ammonium-chloride) were synthesized by reacting respective alkyl amine (i.e. octyl-amine) and hydrogen halide acid (i.e. HI, HBr and HCl) in a similar method as described for MAI.

Perovskite Nano-Crystal Synthesis:

Alkylammonium lead halide perovskites are synthesized by reacting alkyl-ammonium halide and Lead halide in the following reaction; $RNH_3X + PbX_2 \rightarrow RNH_3PbX_3$ (R=alkyl group). The length of alkyl group and halide group can be varied maintaining their required stoichiometric ratio to achieve crystals with varying size and photo-physical properties.

$CH_3NH_3PbX_3$ (MAPbX$_3$) (where; X=Br, I and Cl):

MAPbX$_3$; methyl ammonium lead halide (where X=Cl, Br or I) perovskite crystals were synthesised by using methyl-ammonium-halides (MACl, MABr and MAI) and the lead halide (PbCl$_2$, PbBr$_2$ and PbI$_2$) precursor. To synthesis MAPbBr$_3$, equimolar MABr and PbBr$_2$ typically, 0.0112 gm of MABr and 0.0367 gm of PbBr$_2$ was dissolved in 7 ml of anhydrous dimmethylformamide (DMF). 10 μl of as-prepared precursor solution was injected at 5 min interval in to 10 ml anhydrous toluene under vigorous stirring. As soon as the precursor solution is injected in to the non-coordinating solvent (e.g. toluene), MAPbBr$_3$ precipitates out as nano-crystals (NCs). To synthesize MAPbCl$_3$ a similar method was followed as for the MAPbBr$_3$. However, MAPbI$_3$ perovskite nano-crystals were prepared by a similar method except for the solvent used to prepare the precursor solution, where a DMF and ACN solution mixture was used instead of pure DMF. Equimolar amounts of MAI (0.0159 gm) and PbI$_2$ (0.0416 gm) were dissolved first in 200 μl of DMF followed by addition of 6.8 ml of ACN. The precursor solution was injected in to toluene similarly as described above. We note that can also be used, although the solubility of PbI$_2$ in acetonitrile (ACN) is much lower. To improve the stability of perovskite crystals in toluene, oleic acid can also be added in to toluene solution. Typically about 40 mg of oleic acid was added in the 10 ml of toluene before the injection of the precursor solution.

$CH_3(C_8H_{17})NH_3PbX_3$ [MA(OA)PbX$_3$] (where; X=Br, I and Cl):

Here we demonstrate the synthesis of mixed alkyl lead halide perovskite i.e. MA(OA)PbX$_3$. The entire process of nano-crystal synthesis was as described earlier for MAPbX$_3$ except for the addition of a longer chain length alkyl group into the precursor solution. While maintaining constant total molar concentration of alkyl ammonium halide, the molar ratios of Methyl ammonium halide (MAX) and octyl ammonium (OAX) were varied to 1:0, 0.7:0.3 and 0.4:0.6 respectively. Typically, to synthesise MA(OA)PbBr$_3$ nano-crystals, appropriate amounts of octyl-ammonium-bromide (OABr), methyl-ammonium-bromide (MABr) and PbBr$_2$ were mixed in 7 ml of anhydrous DMF to prepare the perovskite precursor solution to maintaining the total concentration of alkyl-ammonium halide as equimolar with the lead halide. Subsequently, 200 μl of the respective precursor solution was injected (5-10 μl each time) into the 10 ml toluene/or toluene-polymer matrix solution at interval of 5 min.

We note that the injection of the precursor solution into the toluene-polymer matrix improves the mono-dispersion and stability of the colloidal perovskite crystal markedly. PMMA, polystyrene or polycarbonate can be used for this purpose. In this study we dissolved 4 wt % of polymer (i.e. PMMA) in toluene to make a clear solution. The desired perovskite precursor solution was then injected in a small proportion (5-10 μl) at 5 min intervals in the polymer-toluene solution to achieve a stable perovskite.

Solid State Synthesis Route (MAPbX$_3$; X=Br, I and Cl):

The organic-inorganic perovskite can also be synthesised by solid-state reactions. An equimolar ratio of the alkyl-ammonium-halide and lead halide powders were mixed thoroughly under inert atmosphere. The mixture was ground and then annealed at 100° C. for 20 min. The grinding and annealing process was repeated 5-6 times to achieve a homogenous mixture. The perovskite already starts to form by mixing the reactants even without annealing. However the process of annealing helps to form and improve the stability of the perovskite crystals. The as synthesised perovskite crystallites are then dispersed in toluene/or toluene-polymer.

Nano-Crystal/Polymer Film Fabrication:

We demonstrate the fabrication of films of the nano-crystal (NCs) by mixing them with polymers (i.e PMMA) To fabricate perovskite NCs-polymer film, the as-synthesised perovskite NCs (in solution) were centrifuged for an hour at 7000 rpm (Fisher Scientific, AccuSpin 400) and blended with a desired amount of polymer. The nano-crystal and polymer concentration can be varied to achieve a certain level of absorbance and PLQE providing absolute flexibility in tuning the desired spectral region and intensity of the final PL emission.

Characterisation of NCs:

Photo-physical properties (e.g. UV-Vis absorption, PL emission and quantum yield) of the NCs/toluene were performed using cuvettes. X-ray diffraction of the nano-crystal film was measured using Bruker D8 theta/theta (i.e. fixed sample) spectrometer with a position sensitive detector (LynxEye) and a standard detector (SC) with auto-absorber and graphite 2nd beam monochromator (Bragg Brentano para focusing geometry, reflection mode). Transmission electron microscopy (TEM) was performed using a Jeol 4000EX (400 kV) high resolution microscope. UV-vis absorption was measured on NCs/toluene dispersions in air using a commercial spectrophotometer (Varian Cary 300 UV-Vis, USA). The steady state PL was collected using a high-resolution mono-chromator and hybrid photomultiplier detector assembly (PMA Hybrid 40, PicoQuant GmbH). Time-resolved PL measurements were acquired using a time correlated single photon counting (TCSPC) setup (FluoTime 300, PicoQuant GmbH). NCs/toluene dispersion were photo-excited using 405 nm (for Br/I based perovskite and Cl based perovskite respectively) laser head (LDH-P-C-510, PicoQuant GmbH) pulsed at frequencies of 1 MHz, with a pulse duration of 117 ps and fluence of ~300 nJ/cm$^2$. Photoluminescence quantum efficiency (PLQE) measurements were carried out using a 405 nm CW laser excitation source (Suwtech LDC-800) to illuminate a diluted NC colloidal sample in an integrating sphere (Oriel Instruments 70682NS), and the laser scatter and PL collected using a fiber-coupled detector (Ocean Optics MayaPro). we also state that the dilute solutions had OD at the excitation wavelength <0.1. The spectral response of the fiber-coupled detector setup was calibrated using a spectral irradiance standard (Oriel Instruments 63358). Excitation intensities were adjusted using optical density filters.

Results and Discussions:

Perovskite NCs with Short and Long Alkyl Chains:

Following the route of Papavassiliou et al., (J. Mater. Chem. 2012, 22, 8271-8280) we synthesised $CH_3NH_3PbX_3$ (X=Cl, Br and I) perovskite NCs by the controlled precipitation of $CH_3NH_3^+$, $Pb^{2+}$ and $X^-$ in to a non-coordinating solvent (e.g. toluene). To provide $CH_3NH_3^+$, $Pb^{2+}$ and $X^-$ ions, we dissolved their respective ionic salts (i.e. methylammonium (I) halide and lead (II) halide) in a polar solvent such as dimethylformamide (DMF) and/or acetonitrile (ACN), and subsequently injected this mixture in to anhydrous toluene to form a suspension of $CH_3NH_3PbX_3$ NCs. We observe that slower (e.g. 5-10 minute intervals) and smaller portion (i.e. 0.2-0.5 μmol) of precursor injection into toluene gives much stable NC. Adding oleic acid into the toluene also helps to stabilise the NCs. DMF can be used to prepare the precursor solution for $CH_3NH_3PbBr_3$ ($MAPbBr_3$) and $CH_3NH_3PbCl_3$ ($MAPbCl_3$) NCs. However, for synthesising $CH_3NH_3PbI_3$ ($MAPbI_3$) NCs, we prepared precursor solution in DMF/ACN mixture.

To confirm the crystal structure of as synthesised NCs, we centrifuged them and performed X-ray diffraction on the perovskite NCs powder. The X-ray diffraction patterns confirm the cubic structure with Pm-3m (no. 221) as a space group for $MAPbCl_3$ and $MAPbBr_3$ at room temperature. However, $MAPbI_3$ crystallise with tetragonal crystal symmetry with I4/mcm space group (No. 140) at room temperature. Our crystallographic observations agree well with literature on larger crystals.

To produce perovskite NCs intrinsically stabilized by long alkyl chains, we mixed the octyl ammonium cation ($OA^+$) as a long alkyl group with the methyl ammonium cation ($MA^+$) while maintaining overall molar ratio of the alkyl ammonium cation a constant with respect to the inorganic components. To investigate the influence of longer alkyl ammonium cation (e.g. $OA^+$) incorporation in the NCs lattice, we synthesized $(OA/MA)PbBr_3$ NCs with varying (i.e. $OA^+$/$MA^+$) molar ratios of 0.0/1.0, 0.3/0.7, 0.6/0.4 and 0.9/0.1 respectively. From the XRD spectrum we confirmed that the NCs with neat $MA^+$ (i.e. $MAPbBr_3$) crystallizes in cubic crystal structure with space group Pm-3m (no. 221) with lattice parameter a=b=c 5.9495 Å. Furthermore, neat $OA^+$ based perovskite NCs crystallise as $(OA)_2PbBr_4$ with a layered crystal structure.

Interestingly, with the mixed $OA^+$/$MA^+$ composition of up to $0.6OA^+$/$0.4MA^+$ molar ratio, we do not observe any identifiable traces of the layered perovskite $(OA)_2PbBr_4$ and we only observe a single-phase cubic crystal structure with similar lattice parameter as for neat $MAPbBr_3$. Upon further increasing the $OA^+$ molar ratio, i.e. 0.9 $OA^+$/0.1 $MA^+$, We observe what appears to be a mixed phase or a mixture of different families of NCs or colloids, as we discern from the x-ray diffraction patterns in FIG. 2, consisting of $(OA)_2PbBr_4$, OABr and $PbBr_2$ along with $MAPbBr_3$. It is interesting to note that up to $0.6OA^+$/$0.4MA^+$ molar ratio, NCs show predominantly a single-phase (i.e. with the cubic crystal structure of $MAPbBr_3$).

The TEM images which we show in FIG. 1, highlight the shape and dimensions of the NCs with varying $OA^+$/$MA^+$ composition. NCs with neat $MA^+$ (i.e. $MAPbBr_3$) form a cubic shape (FIG. 1a). Interestingly, with the addition of $OA^+$ group (e.g. $0.6OA^+$/$0.4MA^+$), we observe an elongated shape consistent with the formation if sheets or plates (FIG. 1b) and with further increasing the $OA^+$ content to $0.9OA^+$/$0.1MA^+$, we observe more rod like geometry. The average width of plates and rods is around 50 nm, while the length varies from around 100 nm for $0.6OA^+$/$0.4MA^+$, to several hundreds of nm for $0.9OA^+$/$0.1MA^+$. On the basis of these TEM images it is apparent that varying the relative fraction of the $OA^+$ content causes a change in growth conditions of the crystal which has an impact upon the resultant shape. In the bottom panel (FIG. 1) we show HRTEM image of the NCs with $MA^+$ and 0.9OA+/$0.1MA^+$ clearly displaying an ordered crystal structure (as confirmed in the Fast Fourier Transform in the inset). In the FFT of both crystals the crystalline lattice, imaged close to a zone axis, appears to be consistent with a cubic structure (such as Pm-3m) corroborating further the observation made in the X-ray diffraction pattern of the NCs.

Considering both the XRD data and the TEM analysis, it appears that the majority of the bulk of the crystals are formed from $MAPbBr_3$, and only when the OA content becomes greater than 60%, do we observe evidence for the existence of layered perovskite phases. The presence of the OA therefore appears to mostly influence the shape of the nanocrystals. The $OA^+$ cations presumably preferentially adsorb to certain crystal facets and as such inhibit extended growth in those directions. We therefore assume that the $OA^+$ will be endowing the surface of the $MAPbBr_3$ crystals, rather than being incorporated into the lattice. In this sense, the $OA^+$ can be considered to be acting as a ligand, similar to the function of phosphonic acids in the growth of III-V nanocrystals.

In the top panel of FIG. 1, we show different geometry of NCs with 3D spheres, nano-plates, and nano-rods for $MA^+$, $0.6OA^+$/$0.4MA^+$ and $0.9OA^+$/$0.1MA^+$ compositions respectively. The thickness of the nano-plates and nano-rods are in the range of <10 crystal. In the bottom panel we show HRTEM image of the NCs with just MA+ and 0.9OA+/ $0.1MA^+$ and in the inset Fast Fourier Transform of the respective NCs. In the FFT of both compositions the crystalline lattice, viewed close to a zone axis, could correspond to a lower symmetry cubic structure (such as Pm-3m).

Figure 3:
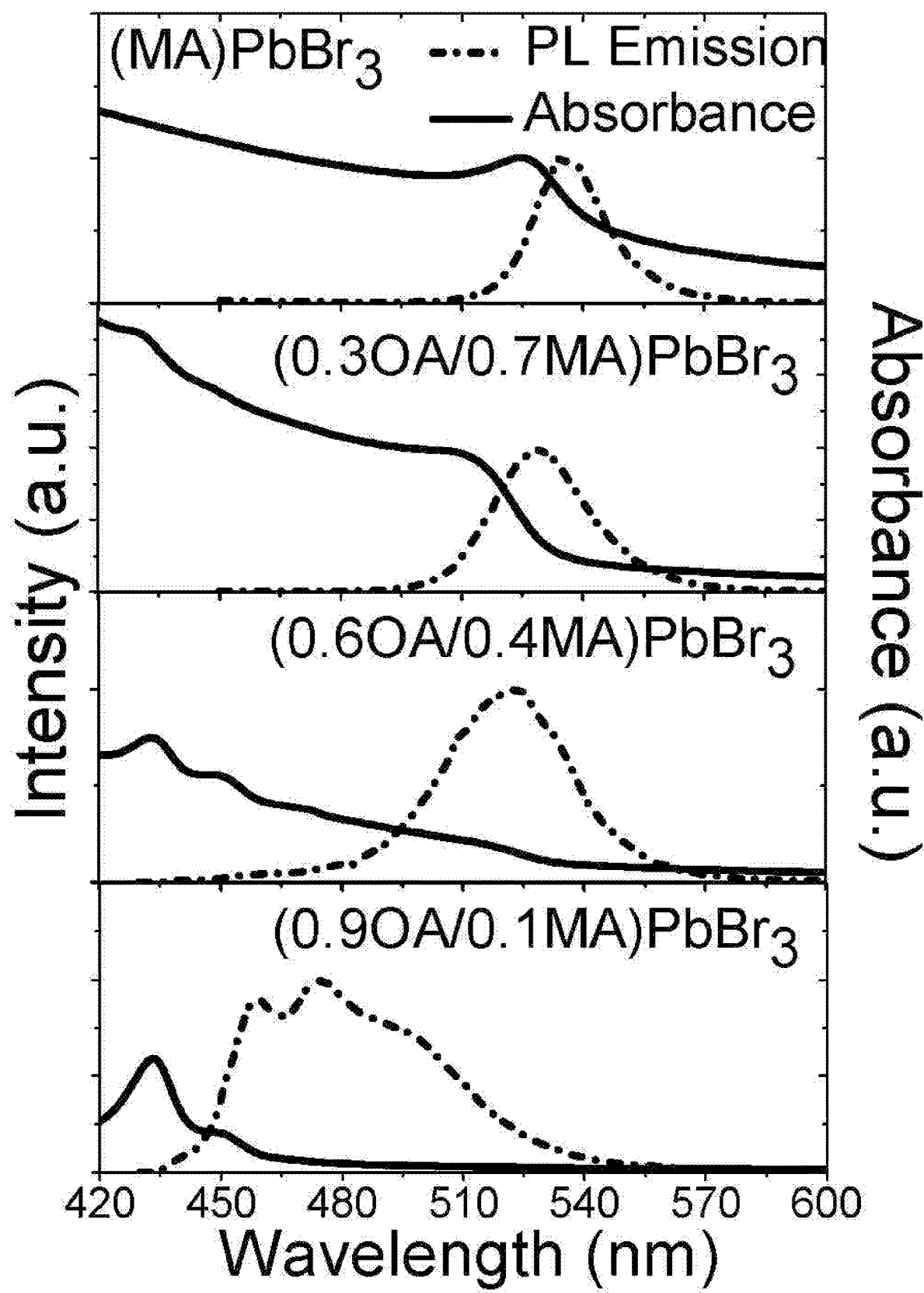
FIG. 3 shows photoluminescent emission intensity (dotted line) and UV-Vis absorbance (solid line) for perovskite NCs comprising varying ratios of octylammonium (OA+) and methylammonium (MA+) cations (i.e. MA$^+$ vs OA$^+$).

To investigate the subsequent effect on the photophysical properties of the NC's, we performed UV-vis absorption, steady state and time resolved photoluminescence (PL) measurements on NCs suspended in toluene. We observe that with increasing molar ratio of $OA^+$ in the $OA/MAPbBr_3$ NCs, the steady state PL emission peak (with 410 nm excitation) shifts towards a higher energy (i.e. blue shifts), as we show in FIG. 3. The PL emission maxima can be tuned from 531 nm (for NCs with neat $MA^+$, i.e. $MAPbBr_3$) to 485 nm (for crystals with 0.9 $OA^+$/0.1 $MA^+$ molar ration). Interestingly, the PL spectra of $MAPbBr_3$ crystals (i.e. with neat $MA^+$) exhibit similar PL peak maxima to the bulk $MAPbBr_3$ film, centered at around 531 nm. A systematic blue shift in PL emission peak could be explained by the quantum confinement effect in the nanostructure with the incorporation of $OA^+$ in the crystal structure. However, the minimum size of the crystals dimensions is on the order of 50 nm. Previous studies have estimated the exciton Bohr radius of $MAPbBr_3$ to be 2-6 nm. With such a small Bohr radius, quantum confinement due to the shape change of the NCs is very unlikely to be responsible for the observed blue shift in PL emission. We hypothesize that the presence of OA on the periphery of the crystals induces some form of strain, which results in the small blue shift in emission going from $MAPbBr_3$ to $0.6OA/0.4MAPbBr_3$. We do note however that further work is required to fully understand these observations. When the molar ratio of $OA^+$ is increased considerably (i.e. 0.9 $OA^+$/0.1 $MA^+$) we observe a multiple higher energy peaks in the emission spectra. Those high energy peaks are likely to corresponds to layered perovskites with planes of the MAPbBr$_3$ with different unit cell thicknesses, interspersed with OA planes.

Figure 6:
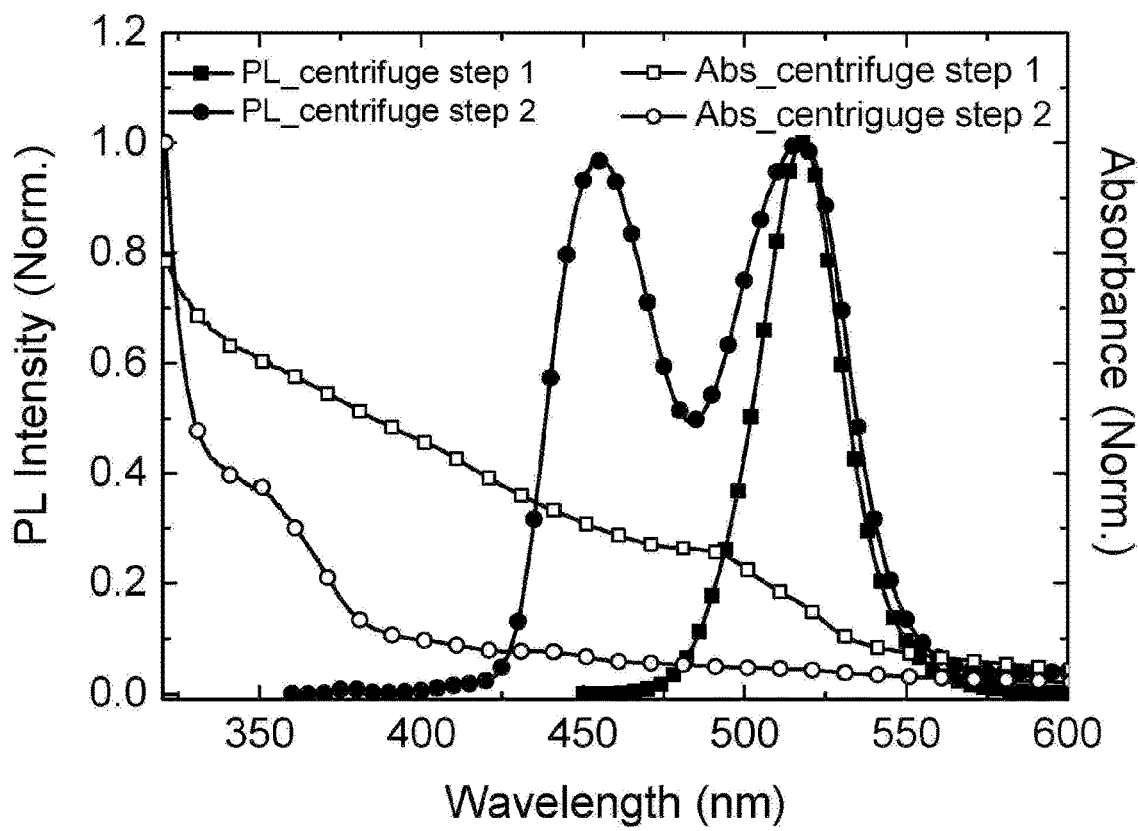
FIG. 6 shows PL intensity and absorbance of NCs synthesized with 90% OA which were separated by the centrifuging at 7000 rpm for varying durations.
Figure 7:
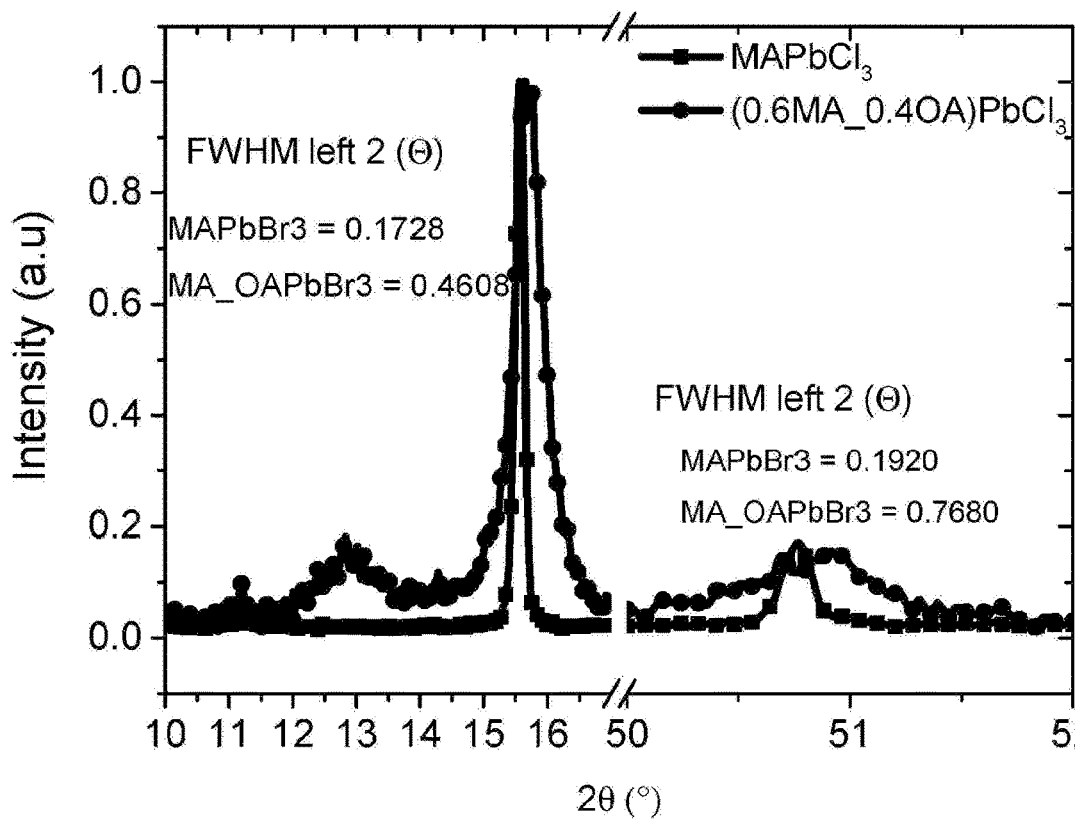
FIG. 7 shows X-diffraction pattern of perovskite without (i.e. MAPbCl$_3$) and with the octylammonium cation (i.e. (0.6MA/0.4OA)PbCl$_3$).

We note that the absorption peaks at higher energy have been previously assigned to layered perovskite layered crystals with different number of unit cell layers, n=1, 3, 4 and ∞ with prominent absorption peaks at 433, 451, 471, and 525 nm, respectively. In FIG. 6, we can separate the NCs synthesized with 90% OA by the centrifuging at 7000 rpm for varying duration. This therefore justifies the very broad emission from the "blue" solution to originate from the heterogeneity of the crystals.

Figure 2:
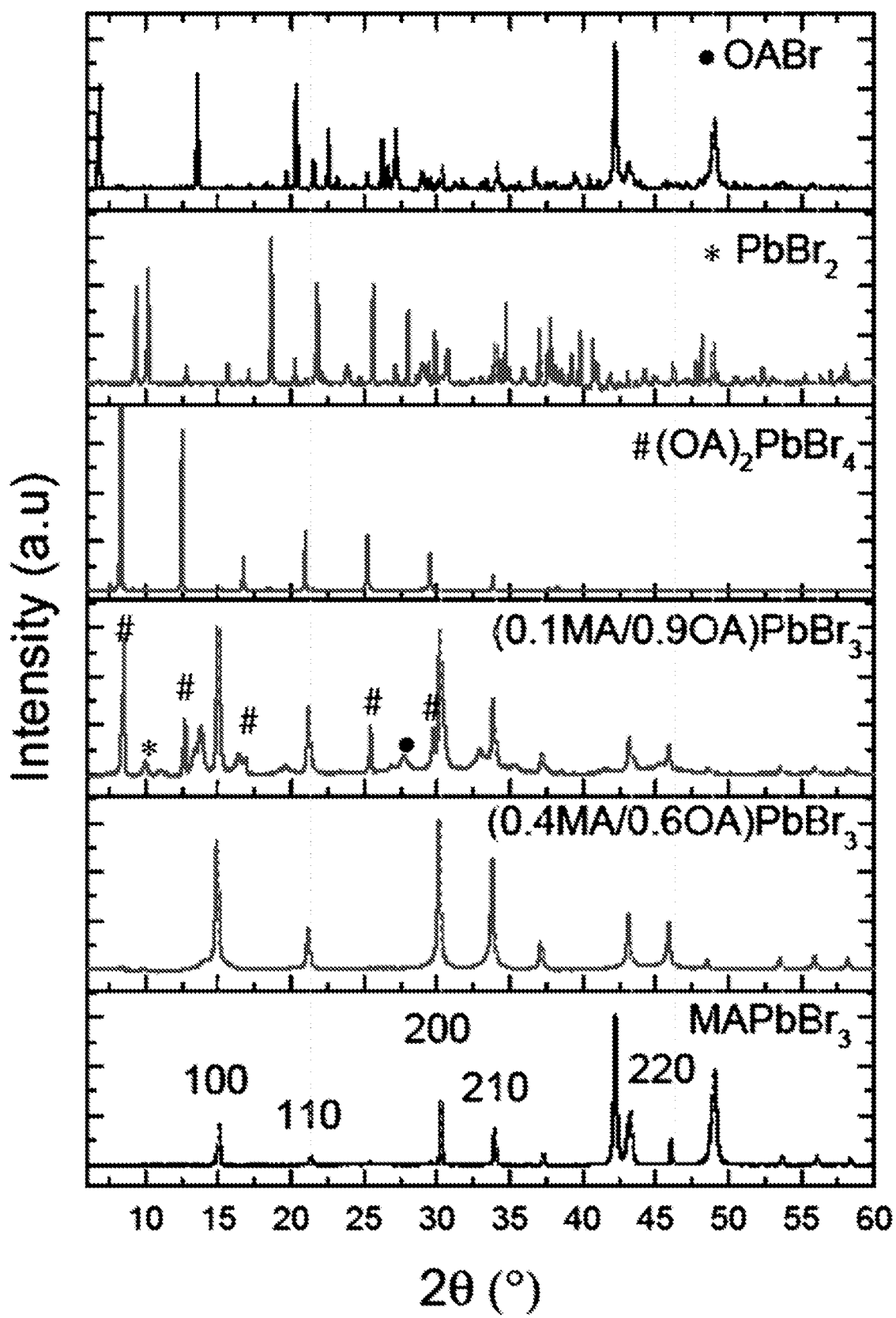
FIG. 2 shows x-ray powder diffraction patterns for, from top to bottom, OABr, PbBr$_2$, (OA)$_2$PbBr$_4$, (0.1MA/0.9OA)PbBr$_3$, (0.4MA/0.6OA)PbBr$_3$ and MAPbBr$_3$.

As we observe in FIG. 2, the stokes shift (i.e. the difference in energy between the absorption and emission wavelengths) increases for the crystals synthesized with mixed MA$^+$ and OA$^+$ cations, which will be useful for reducing self-reabsorption of the emitted light in an LED application.

Figure 4:
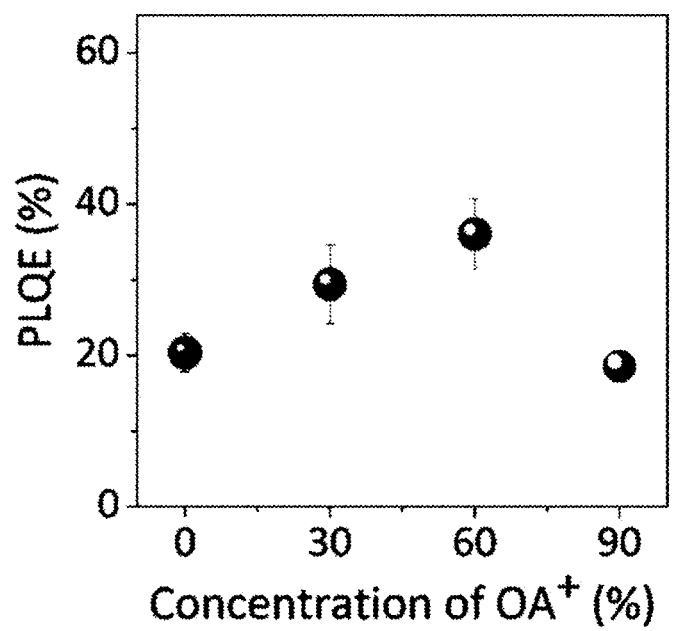
FIG. 4 shows the PLQE measurements when excited at 405 nm of perovskite NCs with varying OA+/MA+ molar ratios.
Figure 5:
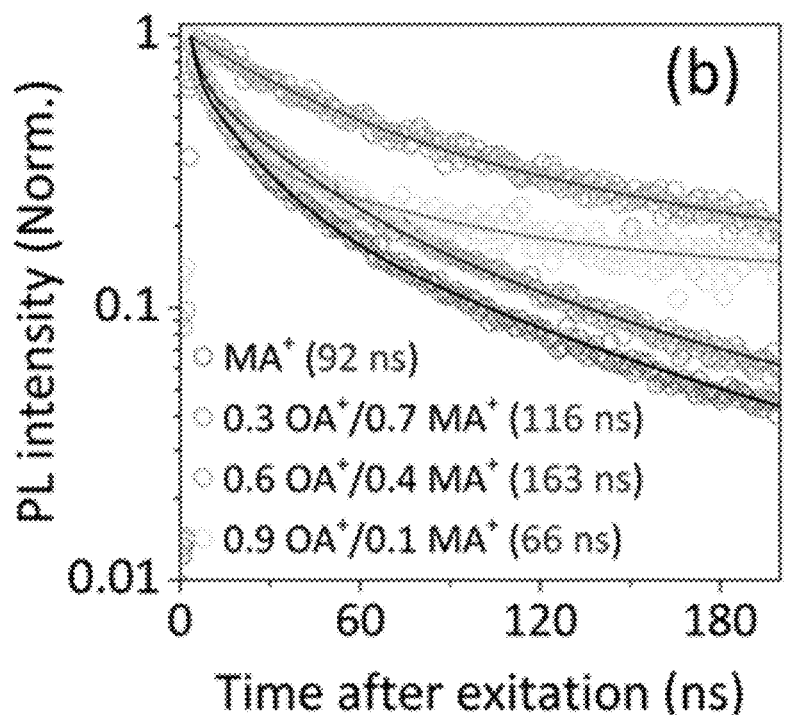
FIG. 5 shows time-resolved photoluminescence (PL) decays of perovskite NCs comprising varying ratios of octylammonium (OA+) and methylammonium (MA+) cations (i.e. MA$^+$ vs OA$^+$.)

We show time-resolved PL measurements of the samples following pulsed excitation at 405 nm in FIG. 5. (Solution samples were photoexcited with pulsed excitation (405 nm, 1 MHz repetition rate, 117 ps pulse length, 300 nJ/cm$^2$/pulse) and the emission was detected at the peak wavelength.) We find that the PL lifetime of the OA/MAPbBr3 NC's increases gradually with increasing OA$^+$ content up to 0.6 OA$^+$/0.4 MA$^+$ molar ratio. However, further increase in the molar ratio to 0.9 OA$^+$/0.1 MA$^+$ leads to substantial decrease in the PL lifetime. We observe a similar trend in the PL quantum yield (QY) of diluted colloidal solution on NCs, measuring 20%, 35%, 52% and 18% for MA$^+$, 0.3OA$^+$/0.7MA$^+$, 0.6OA$^+$/0.4MA$^+$ and 0.9OA$^+$/0.1MA$^+$ containing NCs, respectively, as shown in FIG. 4. An increase in the PL lifetime and PLQE with increasing OA$^+$ incorporation indicates reduced non-radiative losses in the NCs, which could be attributed to lower densities of electronic traps. We expect that this is due to the OA$^+$ endowing the surface of the NCs in a more complete manner than the MA$^+$ cations. However, if there is a strain induced, this could also have an impact upon the luminescent properties of the crystals.

Under UV light, it is apparent that the gradual change in emission color from green to blue with increasing OA$^+$ content in the NC further corroborates the observed blue shifts in the PL emission peak shift. One interesting prospect here is the ability to obtain blue emission from the PA/MAPbBr$_3$ based crystals, without having to move towards OA/MAPbCl$_3$. This could be greatly advantageous for long-term stability, since not only are the Br salts less volatile than the Cl salts, but in addition layered perovskites have been shown to have enhanced moisture resilience than the MAPbX$_3$ perovskites in solar cell applications.

In addition to the improved optical properties of the OA$^+$ incorporated NCs, the longer alkyl chain on the periphery of the crystals prevents them from agglomeration and renders them a long term stable colloidal solution.

Figure 8:
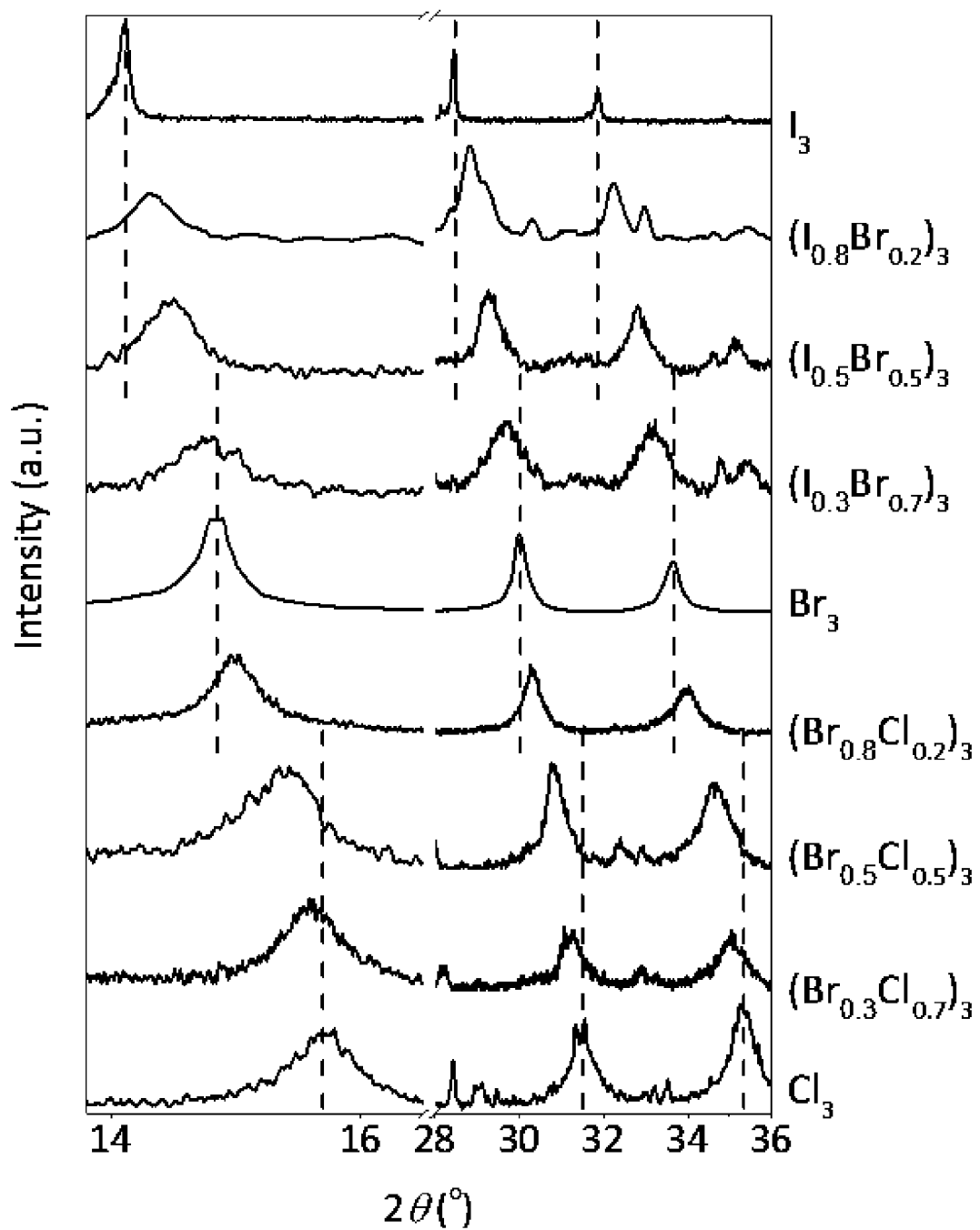
FIG. 8 shows powder X-ray diffraction pattern of mixed halide NCs with varying amounts of different halides. The reflections at (101), (040) and (141) are marked by a dotted line.

Tuning the PL Emission with Mixed Halide Perovskite NCs:

In order to investigate the potential spectral bandwidth and resolution achievable, we have synthesized a series of neat and mixed halide perovskite NCs varying from MAPbCl$_{3-x}$Br$_x$ through to MAPbBr$_{3-x}$I$_x$ with x ranging from 0 to 3. For this work we kept the OA$^+$/MA$^+$ cation ratio fixed at 0.7/0.3. In FIG. 8 we show the X-ray diffraction patters of the single and mixed halide perovskite NCs. As the doping concentration of Br$^-$ anion in to the neat chloride based perovskite NCs is increased, a gradual shift towards lower 2θ is observed for the (101), (040) and (141) peak highlighted. A similar trend is observed when I$^-$ anions are added in to the neat bromide-based perovskite. The shift in the 2θ position and no appearance of a secondary phase confirms the formation of single phase NCs with the mixed halide lattice. At room temperature the neat iodide-based perovskites crystallize in the tetragonal symmetry whereas neat chloride- and bromide-based perovskite in the cubic symmetry.

Figure 9:
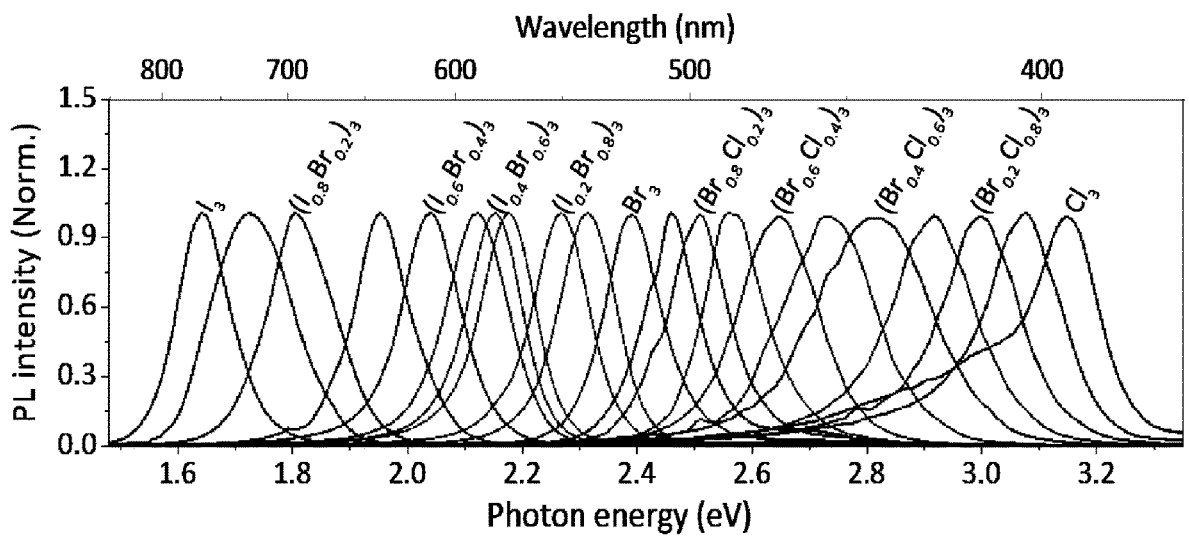
FIG. 9 shows the PL emissions (excitation wavelength=360 nm) of a variety of mixed halide (0.3MA/0.7OA)PbX$_3$ (X=I, Br and Cl) NCs.

In FIG. 9 we show that the emission spectra ($\lambda_{exc}$=360 nm) of colloidal mixed halide OA/MAPbX$_3$ (x=Cl$^-$/Br$^-$/I$^-$) NCs can be tuned over the entire visible spectral region by adjusting their halide composition (ratio of halides in mixed halide NCs). The PL emission peak for OA/MAPbI$_3$, OA/MABr$_3$ and OA/MAPbCl$_3$ are at 770 nm, 522 nm and 385 nm respectively. Intermediate PL emission can be achieved by mixing I$^-$/Br$^-$ and Br$^-$/Cl$^-$ halides in the perovskite NCs. Interestingly, sharp and single PL emission peaks are observed even for the mixed halide-based NCs.

Figure 10:
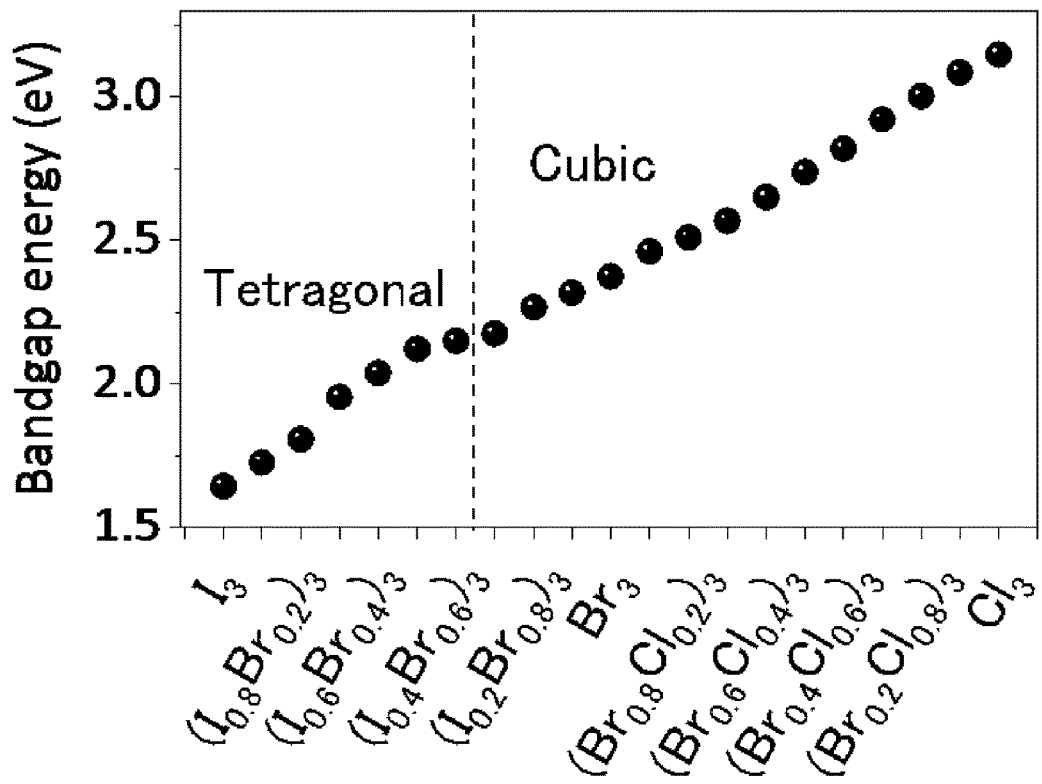
FIG. 10 shows band gap vs stoichiometric ratio of halide ions in a variety of mixed halide perovskite NCs.

The observed trend in the PL emission spectra agrees well with the X-ray diffraction data of the mixed halide perovskite NCs. As would be expected, we found that mixing I$^-$/Cl$^-$ halide did not form stable perovskite NCs, due to their large difference in ionic radii. In FIG. 10 we show the band gap, which we estimate from the PL emission, peak for each starting solution stoichiometry. Apart from a little bump at the tetragonal to cubic phase transitions range, the bandgap varies linearly with composition, indicative of a solid solution of the mixed halides forming within the perovskite crystals over this entire range.

As the anion is varied, the crystal lattice parameter, the octahedral tilting angle and the halide orbitals contributing to the energy band are altered, which results in the variation observed in the photo-physical properties.

Perovskite NC/Polymer Composite Film Fabrication for White Light Emission:

The colloidal solution of the perovskite nano-crystals shows a compositional instability when they are mixed with other NCs with different halide anion. Therefore, any attempt to mix NCs with a distinct PL emission (excitation wavelength 425 nm) to achieve a wide PL emission may not give desirable results. In FIG. 5 (top panel) we show PL emission spectra of the neat Br (MApbBr$_3$) and I (MAPbI$_3$) based perovskite colloidal solution and also the mixed colloidal solution (V/V) of the two (i.e. MA(0.3OA)PbBr$_3$ and MA(0.3OA)PbI$_3$) NCs. The two colloidal solutions were mixed in a way to achieve a reasonably similar PL intensity. The neat Br and I based NCs has a single PL emission peak at 520 and 753 nm respectively.

However, the mixed colloidal solution does show two PL emission spectrum, belonging to both Br and I based NCs but with a different maxima (at 551 and 704 nm respectively) then their respective parental peak positions. The obvious effect of their change in the PL emission spectrum is reflected in the obvious colour change of the mixed colloidal solution.

Figure 11:
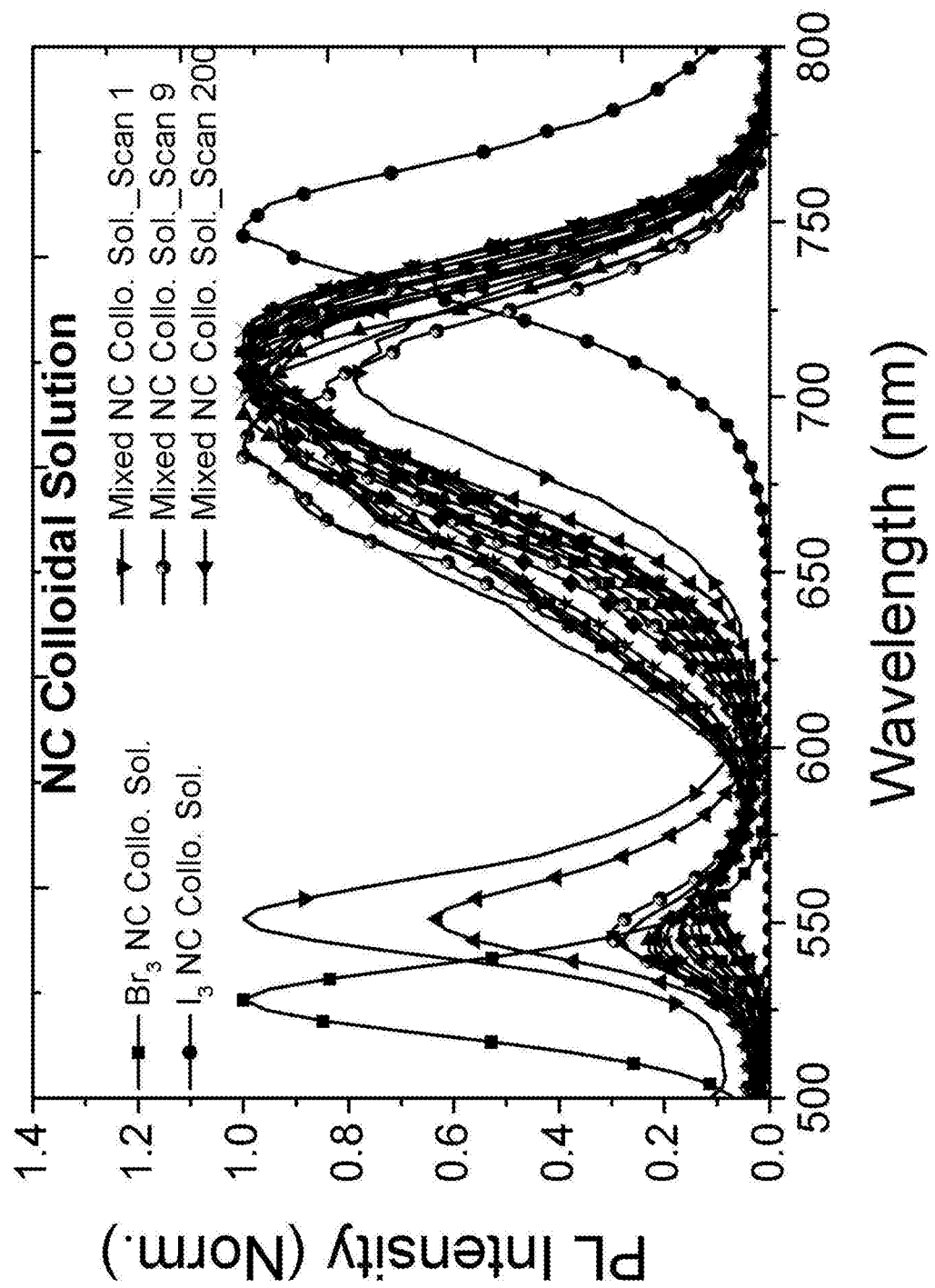
FIG. 11 shows the continuous PL emission ($\lambda_{exc}$=425 nm) in colloidal solution of MA/OAPbI$_3$ (753 nm) and MA/OAPbBr$_3$ (520 nm) NCs (dotted line) and their respective mixed dispersion (551 and 704 nm).
Figure 12:
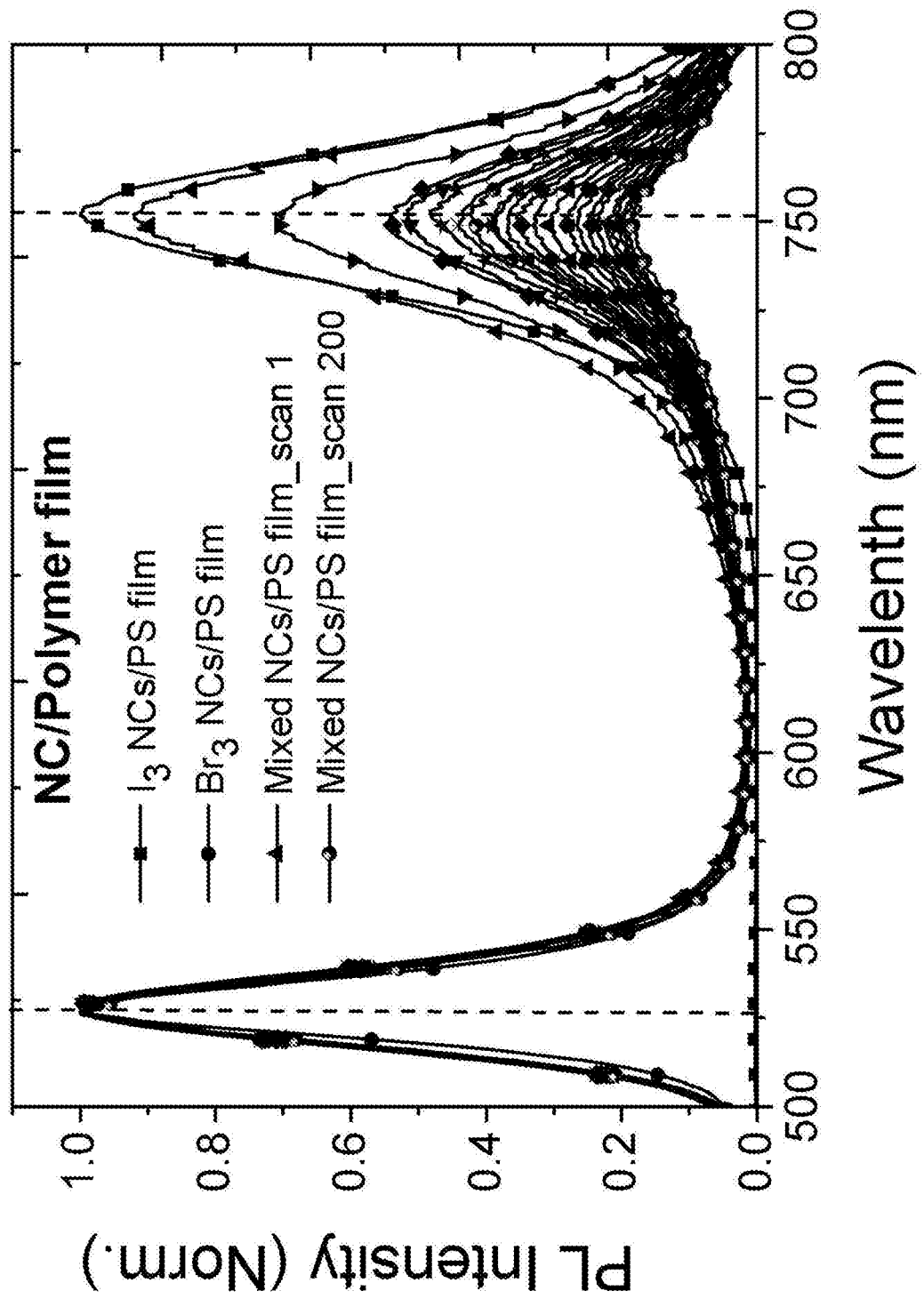
FIG. 12 shows the continuous PL emission ($\lambda_{exc}$=425 nm of MA/OAPbI$_3$ (753 nm) and MA/OAPbBr$_3$ (520 nm) NCs (dotted line) blended in a matrix material.

Further to investigate the compositional stability of the mixed colloidal solution we measured PL emission continuously with constant excitation 425 nm. FIG. 11 shows the PL emission ($\lambda_{exc}$=425 nm) in colloidal solution of MA/OAPbI$_3$ (753 nm) and MA/OAPbBr$_3$ (520 nm) NCs (dotted line) and their respective mixed dispersion (551 and 704 nm). When the mixed colloidal dispersion is excited ($\lambda_{exc}$=425 nm) continuously for several hours, its emission spectrum shows a drastic shift over the time, indicative of composition instability via possible ion exchange in the NCs. FIG. 12 shows the emission spectra of the NC/polymer film, with (MA/OAPbI$_3$) and (MA/OAPbBr$_3$) polymer film emitting at 753 and 520 nm respectively (dotted lines). Blending the two NCs in the polymer matrix does not show any shifts in their respective emission peaks. Continuous excitation ($\lambda_{exc}$=425 nm) for several hours does not show any sign of ion exchange occurring, as their PL peak position remains invariable over the time.

It is evident (FIG. 12) that the mixed colloidal solution undergo compositional fluctuation with the light excitation. However, it is not clear as yet whether the halide anions from the different crystal lattice are exchanging with each other or with the impurity phase halide anion that is already present in the colloidal solution. This ion exchange is discussed further in Example 3.

We also fabricated NC/polymer thin film by blending them in an insulating and transparent matrix, (i.e. PMMA/Polystyrene) and measure the PL emission spectra of the neat halide films and also the film of their respective mixture blends, shown in FIG. 12. Interestingly, we do not observe any variation in the PL emission maxima of the neat halide perovskite NCs and of their respective blends. This evidently suggests that blending the NCs in the polymer matrix can inhibit the possible ion migration between the NCs or even from the residual impurity in the NC/polymer film.

Figure 13:
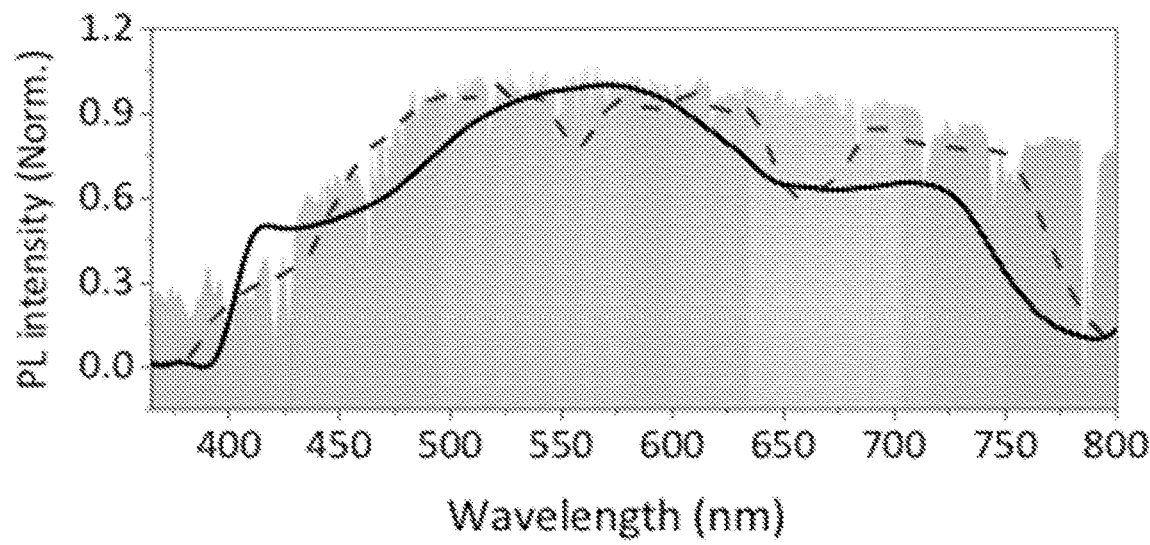
FIG. 13 shows the broad spectrum PL emission of a luminescent material comprising a range of different mixed halide perovskite NCs all embedded within a single polymer matrix. In the background the air mass 1.5 solar spectrum is shown. The dotted line is a semi-empirical spectrum calculated by adding together emission spectrum shown in FIG. 10 with different weighting to each individual emission spectrum in order to closely match the air mass 1.5 natural daylight spectrum.

The selective/broad emission can be realised either by fabricating a film of mixed NCs/polymer composite or by fabricating separate films of different NCs each with their own selective emission and then laminating them together. In FIG. 13 we demonstrate a broad PL emission covering the entire visible spectral region from 410 to 770 nm from a film that was fabricated by mixing blue, green, red and intermediate emitting NCs into the polymer matrix. In FIG. 13 the composition of the perovskite nanocrystals blended in the film are as follows: $(MA_{0.7}OA_{0.3})PbCl_3$=20%; $(MA_{0.7}OA_{0.3})Pb(Cl_{0.4}Br_{0.6})_3$=25%; $(MA_{0.7}OA_{0.3})Pb(Br)_3$=10%; $(MA_{0.7}OA_{0.3})Pb(Br_{0.5}I_{0.5})_3$=25%; $(MA_{0.7}OA_{0.3})PbI_3$=20%.

Figure 14:
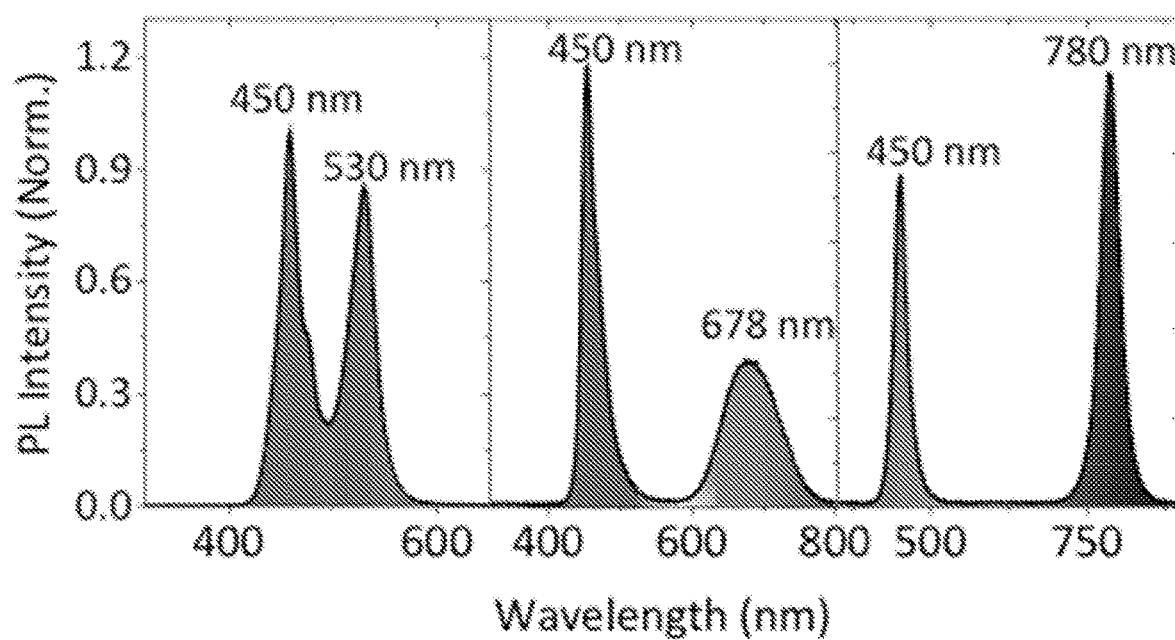
FIG. 14 shows the emissive wavelengths of three different perovskite NC comprising films.
Figure 15:
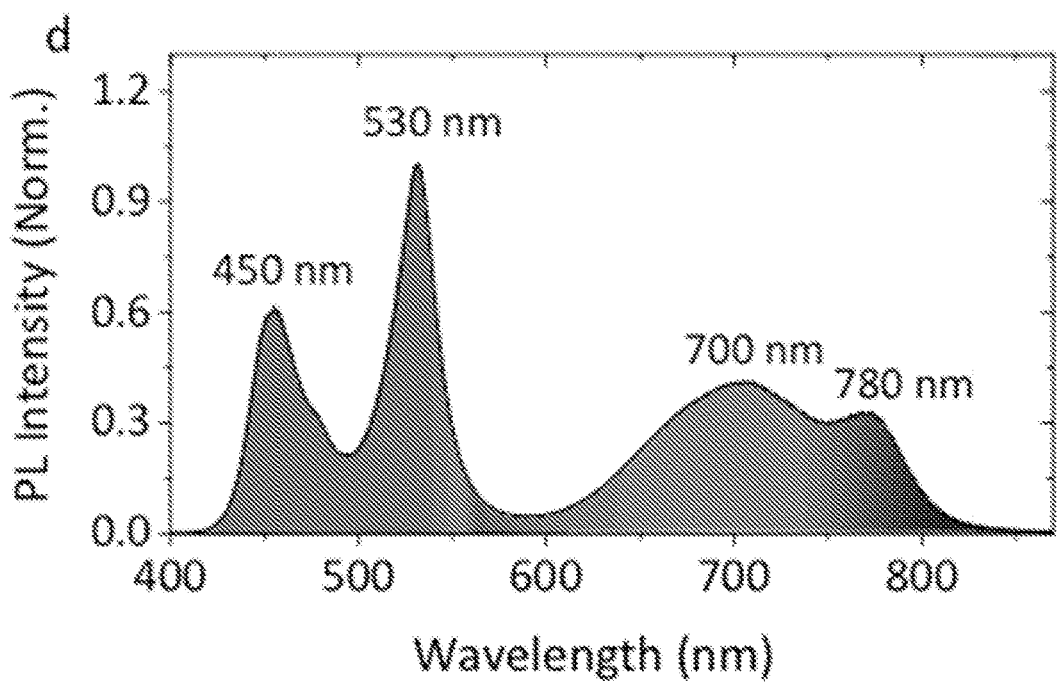
FIG. 15 shows a white light spectrum produced by a blue LED together with a stack of the three perovskite NC films used in FIG. 14.

This wide PL emission is a perfect precursor to generate efficient and tuneable white light emission from a perovskite NC/polymer composite film. In the background to FIG. 13 we show the air mass (AM) 1.5 solar spectrum. In addition, we fabricated individual blue, green and red emitting films by employing perovskite NCs with $Cl^-$, $Br^-$ and $I^-$ halide group respectively. The PLQE of the OA/MAPbI$_3$, OA/MAPbBr$_3$ and OA/MAPbCl$_3$ films were 15, 25 and 10% respectively. The ease in which these flexible films emitting light at a selective spectral region can be synthesized provides enough opportunity to widen their applicability. As described above, commercial white LEDs for solid-state lighting are typically based on GaN blue LEDs with yellow-emitting $Ce^{3+}$-doped $Y_3Al_5O_{12}$ (YAG:Ce) phosphors. Here we demonstrate that the conventional phosphor can be replaced with the blue/green/red-emitting perovskite NCs embedded in a polymer matrix. We positioned the green and red emitting NC/polymer film in front of the commercial blue GaN LED. We ensured that optical density of the perovskite NC thin film was low enough to enable part of the blue light from the GaN LED to be transmitted through the NC polymer films giving a blue emission (450 nm), while the blue light absorbed by the NCs was down converted and reemitted in the green and red spectral regions, giving rise to a desired white light emission. In FIG. 14 we show separate strategies to generate blue-green, blue-red and blue-near IR emission by separately placing MAPbBr$_3$ (emission at 520 nm), MAPb(I$_{0.66}$Br$_{0.34}$)$_3$ (678 nm) and MAPbI$_3$ (775 nm) NC thin films in front of the GaN blue LED. When these NC films are stacked on-top of each other together on top of the blue LED, we observe white light emission, the spectra of which we show in FIG. 15. We note that the 450 nm emission is still visible originating from the blue LED and the remainder is from the perovskite NCs.

Figure 16:
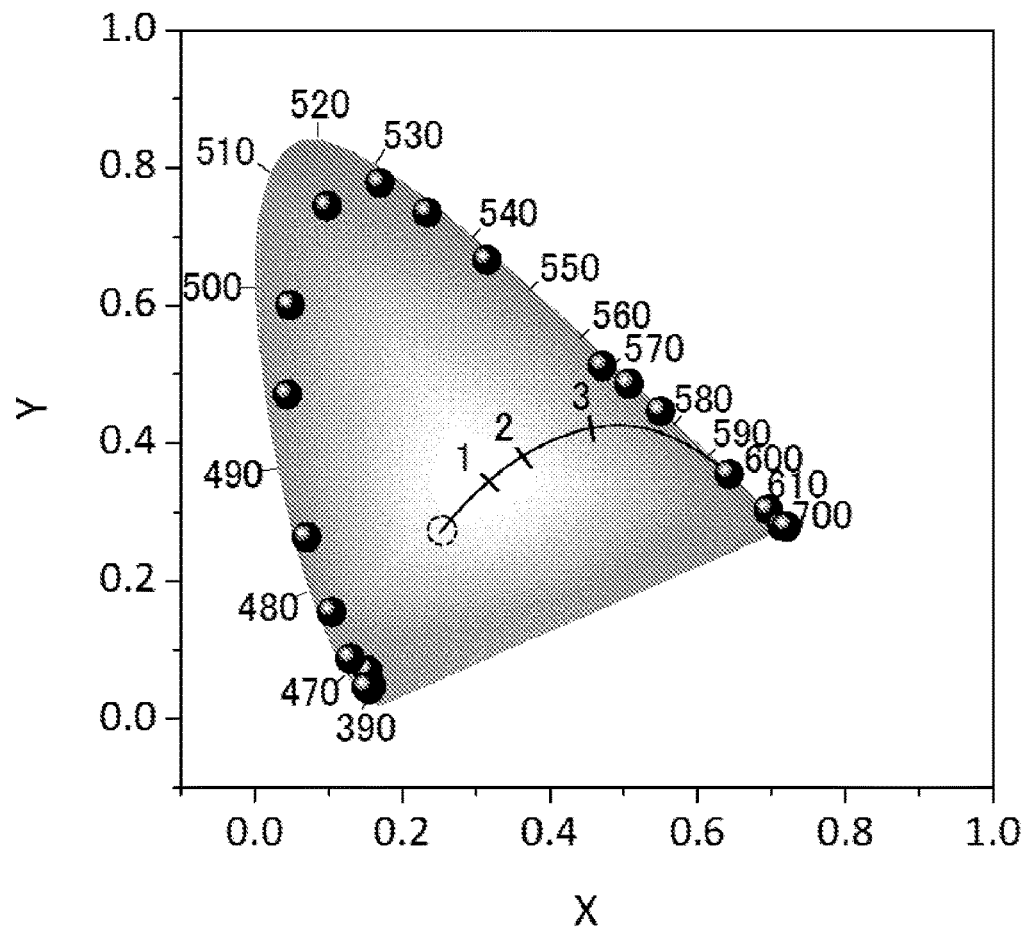
FIG. 16 shows chromaticity colour coordinates (CIE) plotted from the corresponding perovskite NCs emissions.
Figure 17:
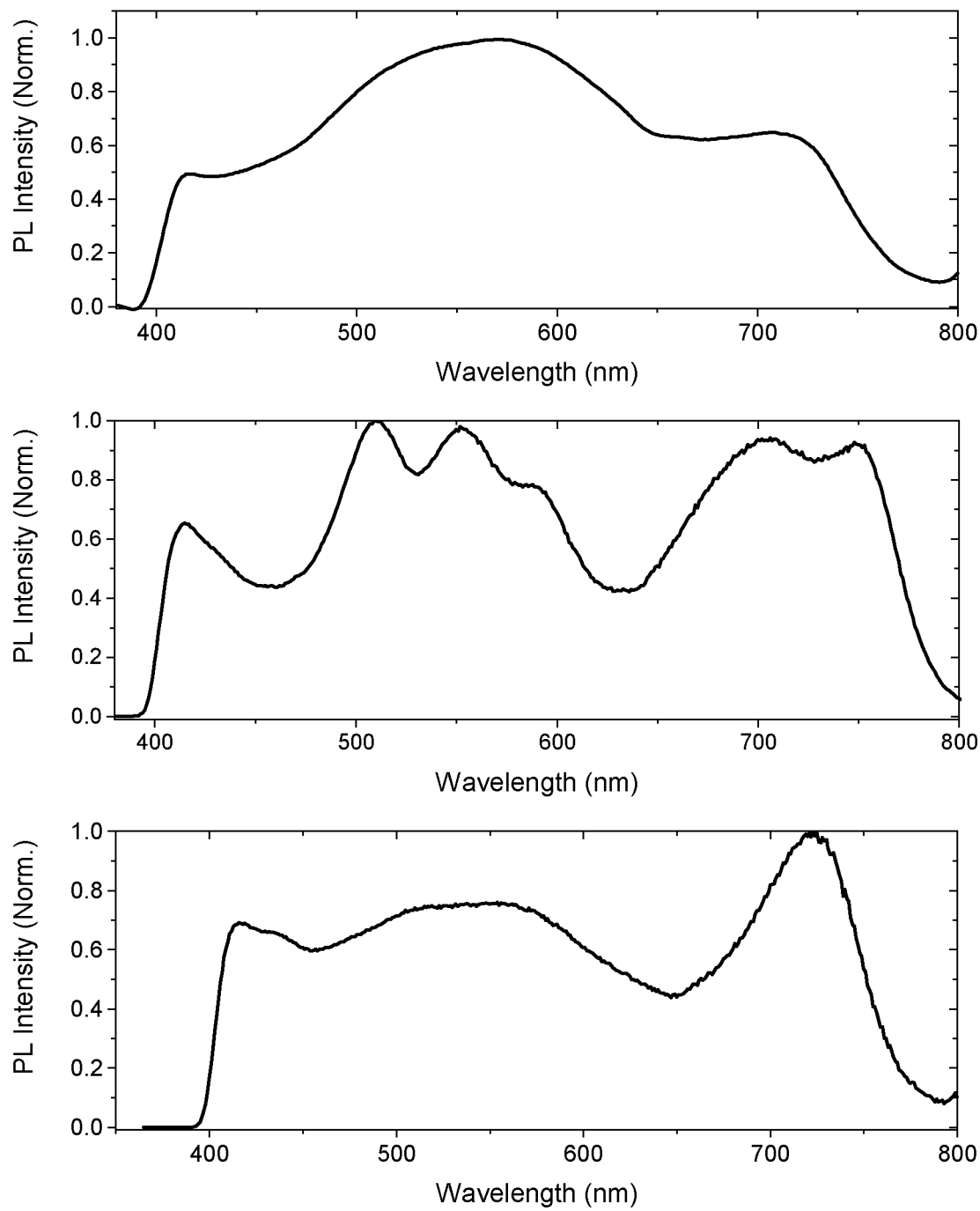
FIG. 17 top, middle and bottom show three wide spectrum PL emission spectra of a perovskite NC blend in a polymer matrix (i.e. NC/polymer film).

We have made a selective demonstration of white light emission from a particular combination of NCs above, with the chromaticity color coordinates (CIE) located at about 0.4120 and 0.4120 x-y coordinates, which we illustrate with the dotted circle symbol in FIG. 16. In principle it is possible to obtain any hue, colour and spectral composition from these perovskite NCs. We illustrate this by showing the CIE coordinates of the individual NC emission from all the PL spectra which we have shown in FIG. 16. Notably, a combination of an appropriate fraction of these NCs into a single film or layered stack of films could position the CIE anywhere on the chart with broad spectral coverage. Spectra of other luminescent materials according to the invention comprising blends of different perovskite nanoparticles are shown in FIG. 17.

Example 2—Ion-Exchange in Perovskite Nano-Crystals

The perovskite nanocrystals (nanoparticles) dispersed in solution show a compositional instability when they are either mixed with perovskite nanocrystals containing different halide ion or by introducing halide ion through other sources. The nanocrystals do not retain their original composition in the presence of another halide ion rather show a strong tendency of undergoing ion-exchange in the crystal leading in to forming a completely new compositions with a different halide compositions. Therefore, any attempt to mix nano-crystals with different PL emission to achieve a wide PL emission may end up forming a complete new PL emission in the intermediate range of the parent nanocrystals.

Figure 18:
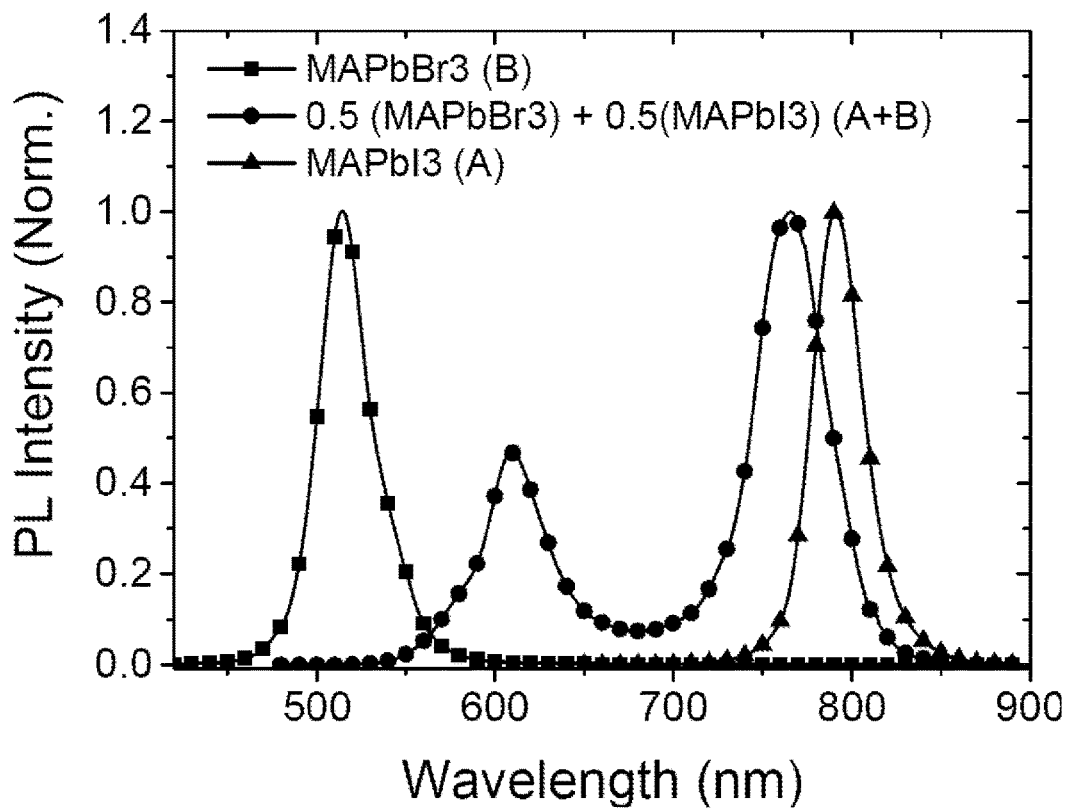
FIG. 18 shows PL emission indicating halide ion exchange between perovskite nano-crystals suspended in toluene.

It has been demonstrated that when a MAPbI$_3$ and MAPbBr$_3$ (MA=methylammonium) nanocrystal suspended in toluene are mixed in 50:50 volume ratios, they provide a completely new PL emission wavelength than their parent nano-crystals. It was found that MAPbI$_3$ and MAPbBr$_3$ when mixed gave a completely new dark-red coloured perovskite crystal. The PL emission the respective nano-crystals are shown in FIG. 18, which confirms that when nano-crystals with different halide constituents are mixed in suspension they do undergo halide exchange and over the periods show a completely different PL emission than their parent's materials.

The PL emission of the CH$_3$NH$_3$PbI$_3$ (780 nm) and CH$_3$NH$_3$PbBr$_3$ (520 nm) nanocrystals in toluene differ significantly from their 50:50 V/V mixed dispersion in toluene (605 and 760 nm). It is clearly visible that mixing the different perovskite nano-crystals (Black and Yellow) gives a completely different PL emission (deep Red) by halide exchange with two peaks visible. It is likely that there is halide exchange and mixed halide nanocrystals are formed in the suspension, with two predominant compositions. One with a higher concentration of iodine, with a PL peak at 760 nm, and the other with a lower concentration of iodine, with a PL peak at 605 nm.

Example 3—Ion-Exchange in Perovskite Nano-Crystals

As discussed above, FIG. 11 shows PL emission spectra of the neat MA$_{0.7}$OA$_{0.3}$PbBr$_3$ and MA$_{0.7}$OA$_{0.3}$PbI$_3$ perovskite nanocrystals in solution and also the PL emission from a mixed NC solution containing a mixture from the two at an approximate 0.4:0.6 Volume to Volume ratio of the $MA_{0.7}OA_{0.3}PbBr_3$ to $MA_{0.7}OA_{0.3}PbI_3$ solutions respectively. The volumetric ratio was chosen so to achieve a reasonably similar PL intensity from the two peaks. The neat $MA_{0.7}OA_{0.3}PbBr_3$ and $MA_{0.7}OA_{0.3}PbI_3$ NC solutions have a single PL emission peak at 520 and 753 nm respectively. However, the mixture of the two NC solutions does show two PL emission spectrum at these same wavelengths, but different PL peak position maxima at 551 and 704 nm. The measurements were performed ten minutes after mixing the solutions. These results are consistent with there being a rapid Br/I ion exchange which takes place in the solutions after mixing. The PL emission peaks from the mixed solutions are consistent with the NCs being of mixed halide composition, with the relative concentration of I being higher in the NCs emitting at 704 nm, than in the NCs emitting at 551 nm. Based on measurements of PL emission from individual solutions of mixed halide NCs, which are shown in FIG. 18, we can estimate that the Br/I ratio for the NCs emitting at 551 and 704 nm are approximately 0.8/0.2 and 0.2/0.8 Br/I respectively. In addition to the shift in PL peaks for the mixed solutions, the intensity of the 551 nm peak diminishes rapidly over time. This indicates a general lack of stability of the green emitting NCs in a mixed solution.

Clearly, this type of ion exchange could be detrimental to prospects of stable and controlled white light emission from mixed perovskite nanocrystals. This observation would therefore deter investigators from incorporating a plurality of perovskite NCs in a single layer. Despite this, the inventors persisted and further investigated mixed perovskite NCs embedded in an insulating encapsulating matrix. They fabricated NC/polymer thin film by blending a mixture of $MA_{0.7}OA_{0.3}PbBr_3$ and $MA_{0.7}OA_{0.3}PbI_3$ at a 0.4:0.6 volume ratio in an insulating and transparent polystyrene matrix. The polystyrene beads (Acros Organics-178890250) were added directly to each individual NC solution at a concentration of 220 mg/ml, and the two solutions were then mixed together and films were cast via depositing a small volume of the mixed solution onto a glass substrate and spin-coating to form a dry film. The PL emission spectra of the neat halide films and also the film of the mixed NC blend are shown in FIG. 12. Surprisingly, there is no significant shift in wavelength position of either the 525 nm peak nor the 750 nm peak. This strongly indicates that embedding the NCs in a polymer matrix inhibits Br/I ion exchange and hence stabilises the emission wavelength. The inventors do observe a slow reduction in the emission intensity of the $MA_{0.7}OA_{0.3}PbI_3$ peak at 750 nm, which indicates a degradation of some form other than ion exchange. Hence, embedding the NCs in an insulating matrix appears to solve the problem of ion exchange, although further developments of the NCs and matrix may be required to achieve total stability of emission for long term light output.

Figure 19:
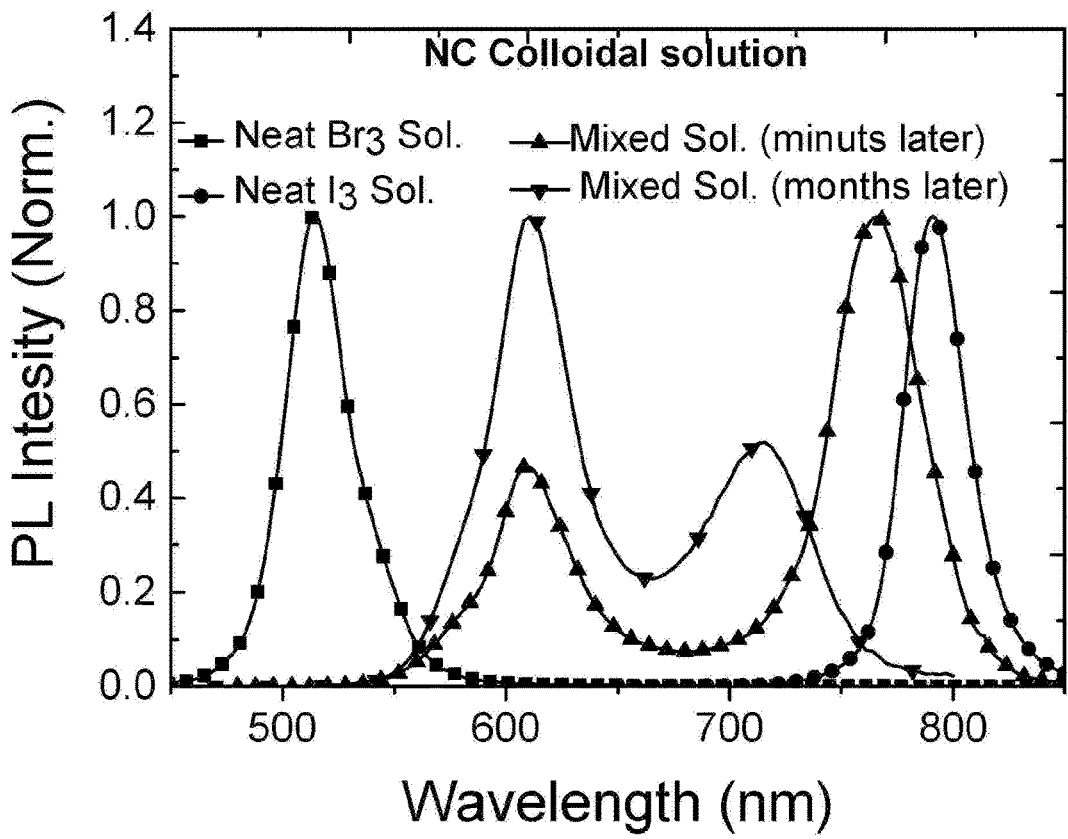
FIG. 19 shows the continued ion exchange between the nanocrystals after several minutes in solution and after several months in solution.

FIG. 19 shows a further shift in the PL emission spectra of the mixed colloidal NC solution after several months. This shows that the ion exchange continues for a considerable amount of time.

Example 4—Photoluminescence Emission Spectra of Mixed Halide Perovskite NCs

PL emission spectra of a wide range of other perovskite nanoparticles were measured to demonstrate the potential for different emission wavelengths.

Figure 20:
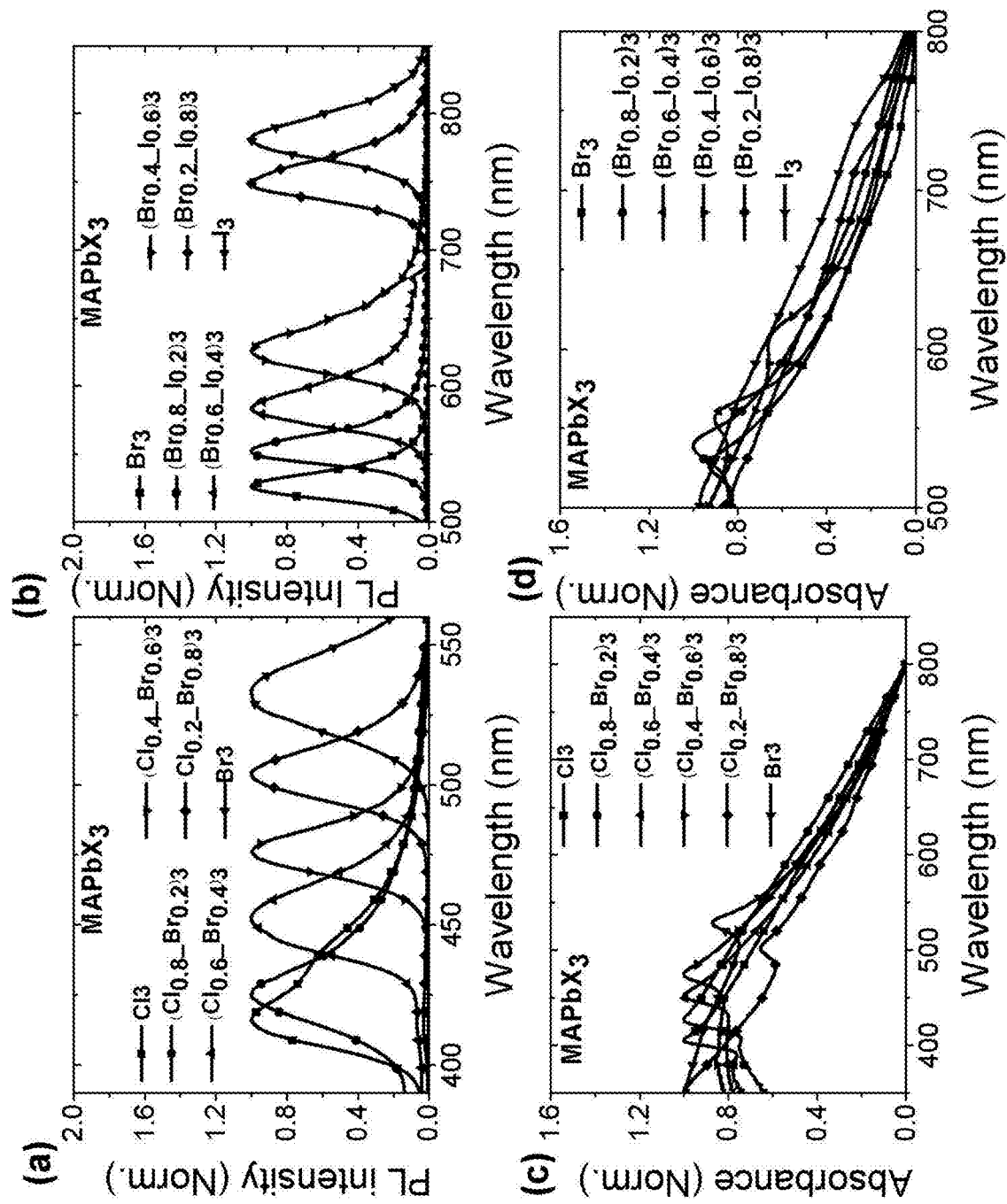
FIG. 20 shows the PL intensity ((a) and (b)) and absorbance ((c) and (d)) for a variety of mixed halide $MAPbX_3$ perovskites.
Figure 21:
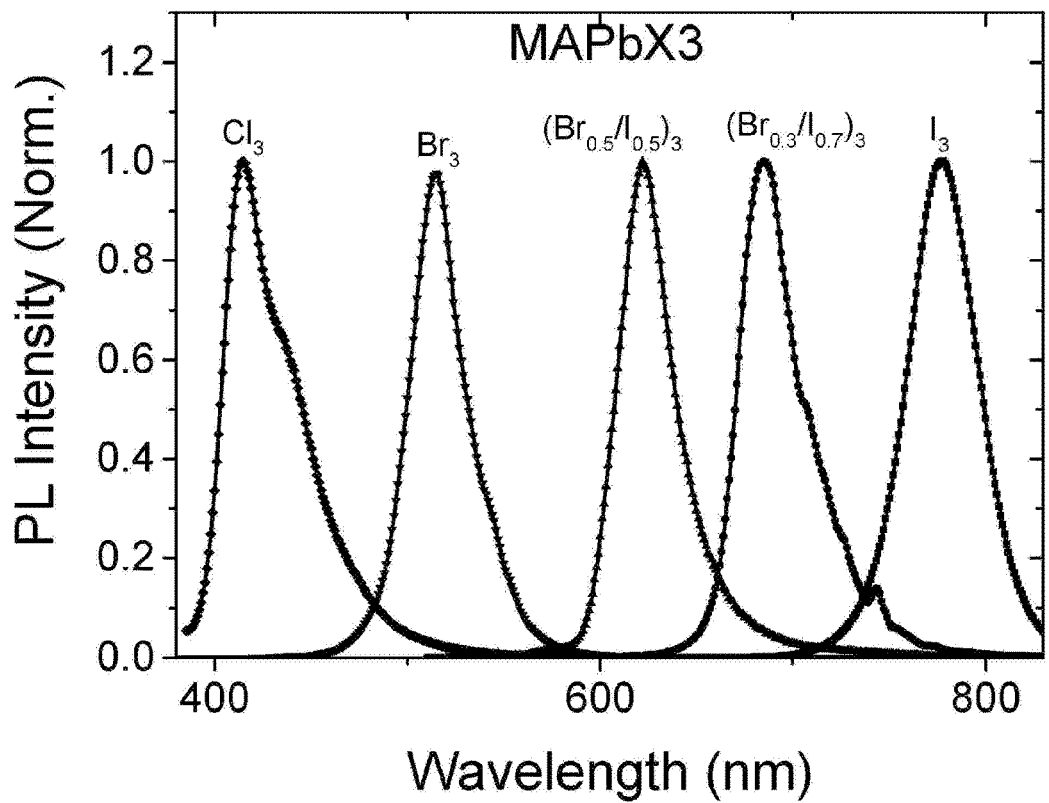
FIG. 21 shows the PL intensity for a variety of mixed halide $MAPbX_3$ perovskites.
Figure 22:
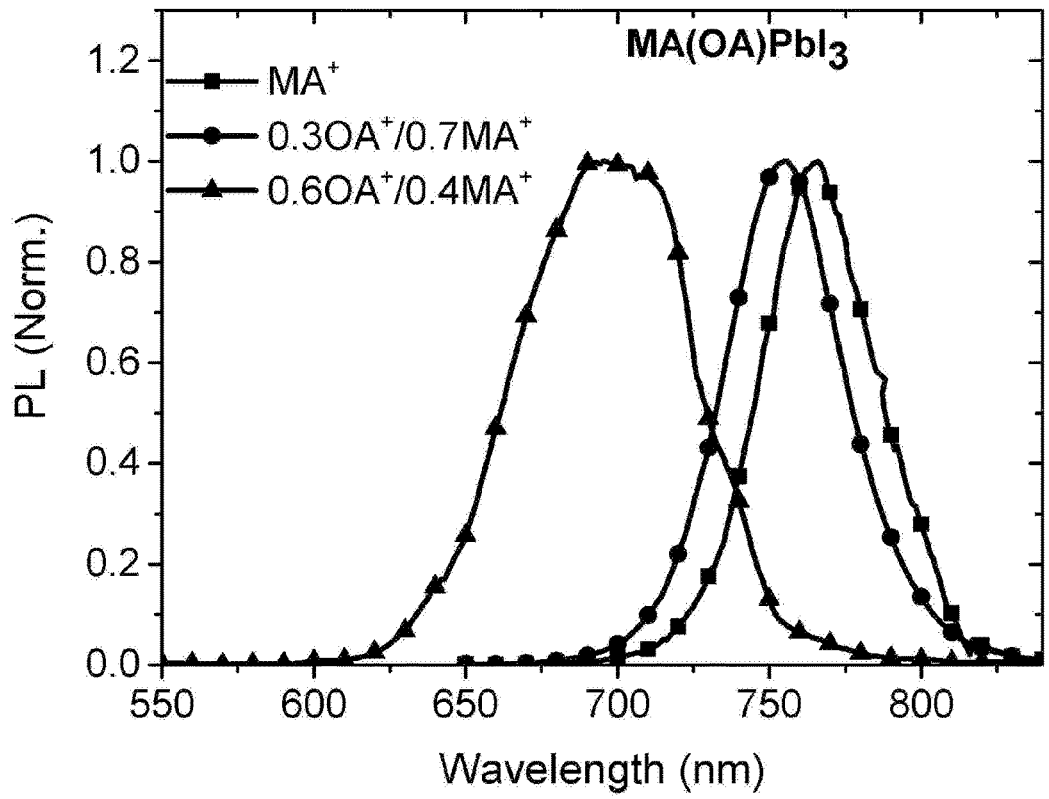
FIG. 22 shows the PL intensity for $MA(OA)PbI_3$ perovskites with varying OA/MA ratios.
Figure 23:
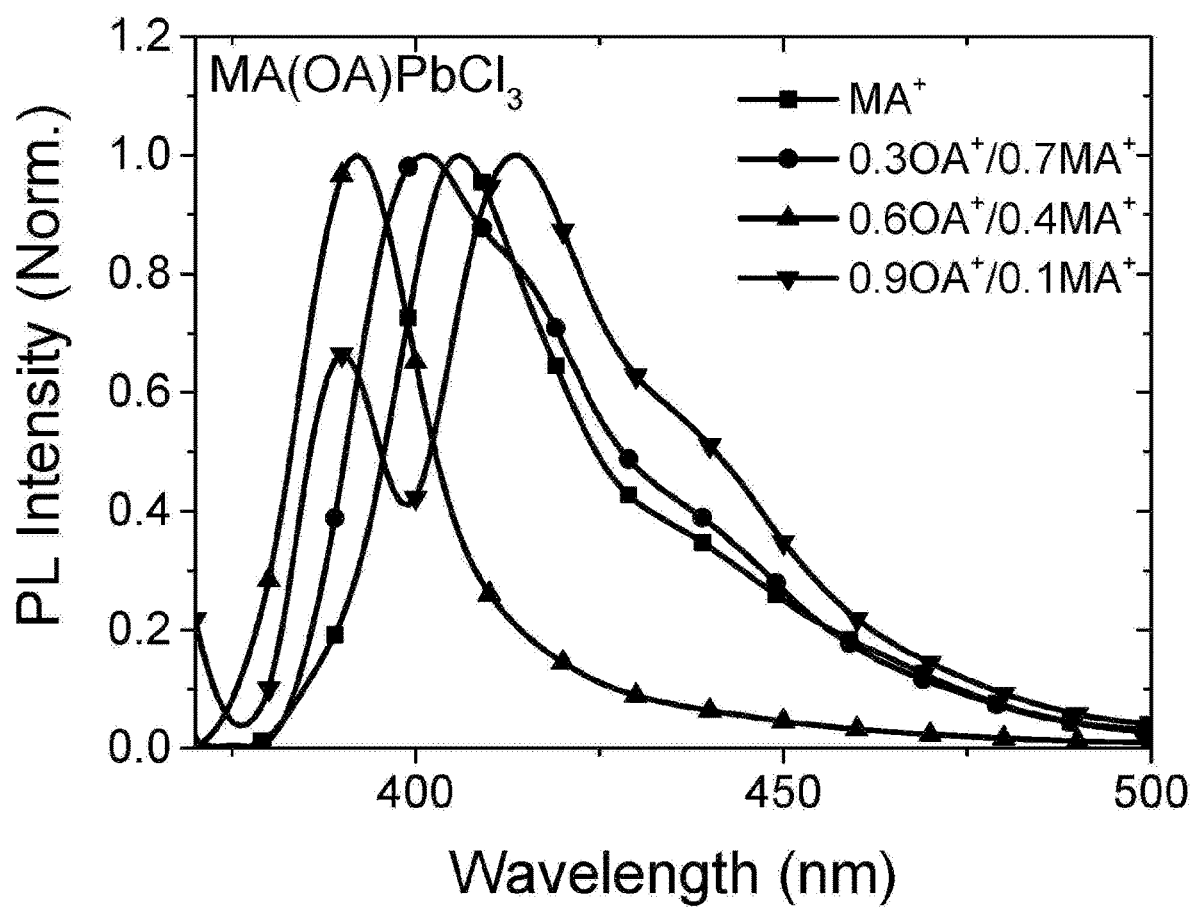
FIG. 23 shows the PL intensity for $MA(OA)PbCl_3$ perovskites with varying OA/MA ratios.

FIG. 20 shows the PL intensity ((a) and (b)) and absorbance ((c) and (d)) for a variety of mixed halide $MAPbX_3$ perovskites. FIG. 21 shows the PL intensity for a variety of mixed halide $MAPbX_3$ perovskites. FIG. 22 shows the PL intensity for $MA(OA)PbI_3$ perovskites with varying OA/MA ratios. FIG. 23 shows the PL intensity for $MA(OA)PbCl_3$ perovskites with varying OA/MA ratios.

SUMMARY

We have demonstrated various synthetic routes to synthesize organic-inorganic perovskites nanocrystals with strong and broad photoluminescence emission across the entire visible range (390-775 nm). We show the formation of 2D nano-plates when a certain fraction of the methylammonium ($MA^+$) cation is substituted with the larger octylammonium ($OA^+$) cation in the 3D perovskite NC, which can then exhibit crystal size quantum confinement and also stabilise of NC suspension in toluene for several months. Furthermore, we showed that incorporation of the octylammonium group substantially enhances the PL lifetime and quantum yield (PLQY). By changing the halide ($X^-$) anions and mixing them in different ratios provides a flexibility to achieve desired PL emission across the UV-Vis spectrum. Attempts to achieve broad PL emission by mixing the NCs suspended in solvent led to a compositional instability and loss of their distinct PL emission. Nevertheless, we demonstrate that perovskite NCs embedded in a polymer matrix can arrest such a compositional instability and hence give stable mixtures of NCs which maintain the favourable photo-physical properties of the individual NCs. Finally, we also demonstrate the emission of white light (and other desired color mixtures) as a proof of concept by employing NC/polymer films atop commercial blue LEDs.

The invention claimed is:

1. A light emitting device comprising a light source and a luminescent material, which luminescent material comprises:
   one or more matrix materials, and, disposed in said one or more matrix materials,
   a first plurality of nanoparticles comprising a first crystalline compound, and
   a second plurality of nanoparticles comprising a second crystalline compound,
   wherein the first crystalline compound and the second crystalline compound are different perovskite compounds of formula (I):

[A][M][X]$_3$   (I)

wherein:
   [A] is at least one monocation;
   [M] is at least one metal or metalloid dication; and
   [X] is at least one halide anion.

2. A light emitting device according to claim 1, wherein the light source has a peak emission wavelength of from 400 nm to 500 nm.

3. A light emitting device according to claim 1, wherein the light source is a light emitting diode comprising gallium nitride.

4. A light emitting device according to claim 1 wherein the first crystalline compound and/or the second crystalline compound is a perovskite compound of formula (II):

[A]M[X]$_3$   (II)

wherein:
   [A] is two or more monocations;
   M is a single metal or metalloid dication; and
   [X] is at least one halide anion.

5. A light emitting device according to claim 1, wherein:
each monocation is independently selected from $Rb^+$, $Cs^+$, $(NR^1R^2R^3R^4)^+$, $(R^1R^2N=CR^3R^4)^+$, $(R^1R^2N-C(R^5)=NR^3R^4)^+$ and $(R^1R^2N-C(NR^5R^6)=NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group; or
each metal or metalloid dication is independently selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$; or
each halide anion is independently selected from $F^-$, $Cl^-$, $Br^-$ and $I^-$.

6. A light emitting device according to claim 1, wherein the first crystalline compound and/or the second crystalline compound is selected from perovskite compounds of formula $CH_3NH_3MX_3$, $CH_3NH_3MX_xX'_{3-x}$, $(CH_3NH_3)_{1-y}(C_8H_{17}NH_3)_yMX_3$ and $(CH_3NH_3)_{1-y}(C_8H_{17}NH_3)_yMX_xX'_{3-x}$,
M is $Cu^{2+}$, $Pb^{2+}$, $Ge^{2+}$ or $Sn^{2+}$,
X is a halide anion which is $F^-$, $Cl^-$, $Br^-$ or $I^-$,
X' is different from X and is a halide anion which is $F^-$, $Cl^-$, $Br^-$ or $I^-$,
x is from 0 to 3, and
y is from 0 to 1.

7. A light emitting device according to claim 1, wherein the first crystalline compound and/or the second crystalline compound is a perovskite compound of formula $(CH_3NH_3)_{1-y}(C_8H_{17}NH_3)_yMX_3$ or $(CH_3NH_3)_{1-y}(C_8H_{17}NH_3)_yMX_xX'_{3-x}$, wherein:
M is $Cu^{2+}$, $Pb^{2+}$, $Ge^{2+}$ or $Sn^{2+}$,
X is a halide anion which is $F^-$, $Cl^-$, $Br^-$ or $I^-$,
X' is different from X and is a halide anion which is $F^-$, $Cl^-$, $Br^-$ or $I^-$,
x is from 0 to 3, and
y is from 0.5 to 0.7.

8. A light emitting device according to claim 1, wherein each halide anion is independently $Br^-$ or $I^-$ or $Cl^-$.

9. A light emitting device according to claim 1, wherein the nanoparticles forming the first plurality of nanoparticles further comprise an unsubstituted $C_{4-16}$ alkyl ammonium halide and/or the nanoparticles forming the second plurality of nanoparticles further comprise an unsubstituted $C_{4-16}$ alkyl ammonium halide.

10. The light emitting device according to claim 1, wherein the first plurality of nanoparticles has a maximum photoluminescent emission of from 400 to 800 nm.

11. A light emitting device according to claim 1, wherein the one or more matrix materials comprises one or more polymeric matrix materials.

12. A light emitting device according to claim 1, wherein the one or more matrix materials are polymeric matrix materials selected from polymethylmethacrylate, polystyrene, polyurethane, a polycarbonate or a polyimide.

13. A light emitting device according to claim 1, wherein the luminescent material comprises:
(a) a first layer comprising greater than 60% of the first plurality of nanoparticles; and
(b) a second layer comprising greater than 60% of the second plurality of nanoparticles.

14. A light emitting device according to claim 1, wherein the first plurality of nanoparticles form a first layer and the second plurality of nanoparticles form a second layer.

15. A light emitting device according to claim 1, wherein the first plurality of nanoparticles and the second plurality of nanoparticles are mutually interspersed within the matrix materials.

16. A light emitting device according to claim 1, wherein the first plurality of nanoparticles and the second plurality of nanoparticles have an average particle size of from 2 to 100 nm.

17. A light emitting device according to claim 1, which light emitting device further comprises a third plurality of nanoparticles comprising a third crystalline compound disposed in the matrix materials, which third crystalline compound is different from the first and second crystalline compounds and is a perovskite compound of formula (I):

$$[A][M][X]_3 \qquad (I)$$

wherein:
[A] is at least one monocation;
[M] is at least one metal or metalloid dication; and
[X] is at least one halide anion.

18. A light emitting device according to claim 17, which light emitting device further comprises a fourth plurality of nanoparticles comprising a fourth crystalline compound disposed in the matrix materials, which fourth crystalline compound is different from the first, second and third crystalline compounds and is a perovskite compound of formula (I):

$$[A][M][X]_3 \qquad (I)$$

wherein:
[A] is at least one monocation;
[M] is at least one metal or metalloid dication; and
[X] is at least one halide anion.

19. A luminescent material comprising one or more matrix materials and disposed in said one or more matrix materials:
(i) a first plurality of nanoparticles comprising a first crystalline compound; and
(ii) a second plurality of nanoparticles comprising a second crystalline compound,
wherein said first and second crystalline compounds are different perovskite compounds of formula (I):

$$[A][M][X]_3 \qquad (I)$$

wherein:
[A] is at least one monocation;
[M] is at least one metal or metalloid dication; and
[X] is at least one halide anion.

20. A process for producing a luminescent material, which process comprises combining a first plurality of nanoparticles comprising a first crystalline compound, a second plurality of nanoparticles comprising a second crystalline compound and one or more matrix materials,
wherein said first and second crystalline compounds are different perovskite compounds of formula (I):

$$[A][M][X]_3 \qquad (I)$$

wherein:
[A] is at least one monocation;
[M] is at least one metal or metalloid dication; and
[X] is at least one halide anion.

* * * * *